US012764908B2

(12) United States Patent
Chitaka

(10) Patent No.: US 12,764,908 B2
(45) Date of Patent: Oct. 13, 2026

(54) ELECTRONIC CONTROL UNIT

(71) Applicant: DENSO CORPORATION, Kariya-city (JP)

(72) Inventor: Hiroki Chitaka, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 241 days.

(21) Appl. No.: 18/794,106

(22) Filed: Aug. 5, 2024

(65) Prior Publication Data

US 2025/0081401 A1 Mar. 6, 2025

(30) Foreign Application Priority Data

Aug. 31, 2023 (JP) ................................ 2023-140688

(51) Int. Cl.
*H05K 7/20* (2006.01)

(52) U.S. Cl.
CPC ..... *H05K 7/20518* (2013.01); *H05K 7/20472* (2013.01); *H05K 7/20854* (2013.01)

(58) Field of Classification Search
CPC ... H05K 5/0256–0295; H05K 7/20536; H05K 7/20709; H05K 7/20845; H05K 7/2089; H05K 7/20518; H05K 7/20472; H05K 7/20854; H05K 7/20872; H05K 7/20509; H05K 7/026; H05K 7/1417
See application file for complete search history.

(56) References Cited

U.S. PATENT DOCUMENTS

| | | | | |
|---|---|---|---|---|
| 2006/0197543 A1* | 9/2006 | Sasaoka | ............... | H05K 7/1427 324/756.07 |
| 2012/0113589 A1 | 5/2012 | Sporer | | |
| 2013/0213708 A1 | 8/2013 | Chitaka et al. | | |
| 2016/0004241 A1 | 1/2016 | Yoshiike | | |
| 2016/0135321 A1* | 5/2016 | Korikawa | ............ | G11B 33/125 361/724 |

(Continued)

FOREIGN PATENT DOCUMENTS

| | | |
|---|---|---|
| DE | 102021208175 A1 | 2/2023 |
| GB | 2541103 A | 8/2017 |

(Continued)

OTHER PUBLICATIONS

U.S. Appl. No. 18/794,146, filed Aug. 5, 2024, Chitaka.
U.S. Appl. No. 18/794,289, filed Aug. 5, 2024, Chitaka et al.

*Primary Examiner* — Jacob R Crum
(74) *Attorney, Agent, or Firm* — Posz Law Group, PLC

(57) ABSTRACT

In an electronic control unit, an electronic device including guide members at ends is installable to a rack along an installation direction orthogonal to a thickness direction. A movable member is disposed in the rack and holds a cooling plate to be movable in the thickness direction. The guide member includes a guide groove to receive a protrusion of the movable member. The guide member has an inclined portion, as a part of the guide groove, inclined relative to the installation direction and a holding portion at an end in the installation direction. The electronic device is configured to cause the movable member to move toward the electronic device by guiding the protrusion from the inclined portion toward the holding portion, after the electronic device is placed in a placement position to face the cooling plate, thereby mounted on the rack.

11 Claims, 22 Drawing Sheets

(56) References Cited

U.S. PATENT DOCUMENTS

| | | | | |
|---|---|---|---|---|
| 2017/0112024 | A1* | 4/2017 | Sato | H05K 7/20563 |
| 2017/0118860 | A1* | 4/2017 | Miwa | H05K 7/1487 |
| 2019/0300009 | A1 | 10/2019 | Sakamoto et al. | |
| 2019/0340116 | A1 | 11/2019 | Miyauchi | |

FOREIGN PATENT DOCUMENTS

| | | | |
|---|---|---|---|
| JP | S61-88272 | U | 6/1986 |
| JP | 3020594 | U | 2/1996 |
| JP | H08-125371 | A | 5/1996 |
| JP | H08-204363 | A | 8/1996 |
| JP | 2009054041 | A | 3/2009 |
| JP | 6567894 | B2 | 8/2019 |
| WO | 2019/082647 | A1 | 5/2019 |

* cited by examiner

ELECTRONIC CONTROL UNIT

CROSS REFERENCE TO RELATED APPLICATION

The present application claims the benefit of priority from Japanese Patent Application No. 2023-140688 filed on Aug. 31, 2023. The entire disclosures of the above application are incorporated herein by reference.

TECHNICAL FIELD

The present disclosure relates to an electronic control unit.

BACKGROUND

For example, an electronic unit has a cooling plate fixed to a printed circuit board.

SUMMARY

The present disclosure describes an electronic control unit with improved cooling efficiency of an electronic device. According to an aspect, an electronic control unit includes a rack, an electronic device, a cooling plate, and a movable member. The electronic device is installable to the rack along an installation direction orthogonal to a thickness direction of the electronic device. The cooling plate is disposed in the rack and is movable in the thickness direction of the electronic device. The movable member is disposed in the rack at a position to interpose the electronic device in a direction orthogonal to the installation direction and the thickness direction. The movable member holds the cooling plate to be movable in the thickness direction. The movable member has a protrusion protruding toward the electronic device. The electronic device includes a pair of guide members disposed at ends in the direction orthogonal to the installation direction and the thickness direction. Each of the guide members includes a guide groove to receive the protrusion of the movable member therein. The guide groove extends along the installation direction and has an open end on a leading side in the installation direction. The guide member has an inclined portion, as a part of the guide groove, inclined relative to the installation direction, and a holding portion to hold the protrusion at an end of the guide groove opposite to the open end in the installation direction. The guide groove is configured to guide the protrusion from the inclined portion toward the holding portion after the electronic device is placed in a placement position facing the cooling plate during installation to the rack. The electronic device is configured to cause the movable member to be pulled toward the electronic device in the thickness direction in accordance with the movement of the protrusion from the inclined portion toward the holding portion, so that the electronic device placed in the placement position is brought to a mounting state mounted on the rack.

DETAILED DESCRIPTION

Figure 1:
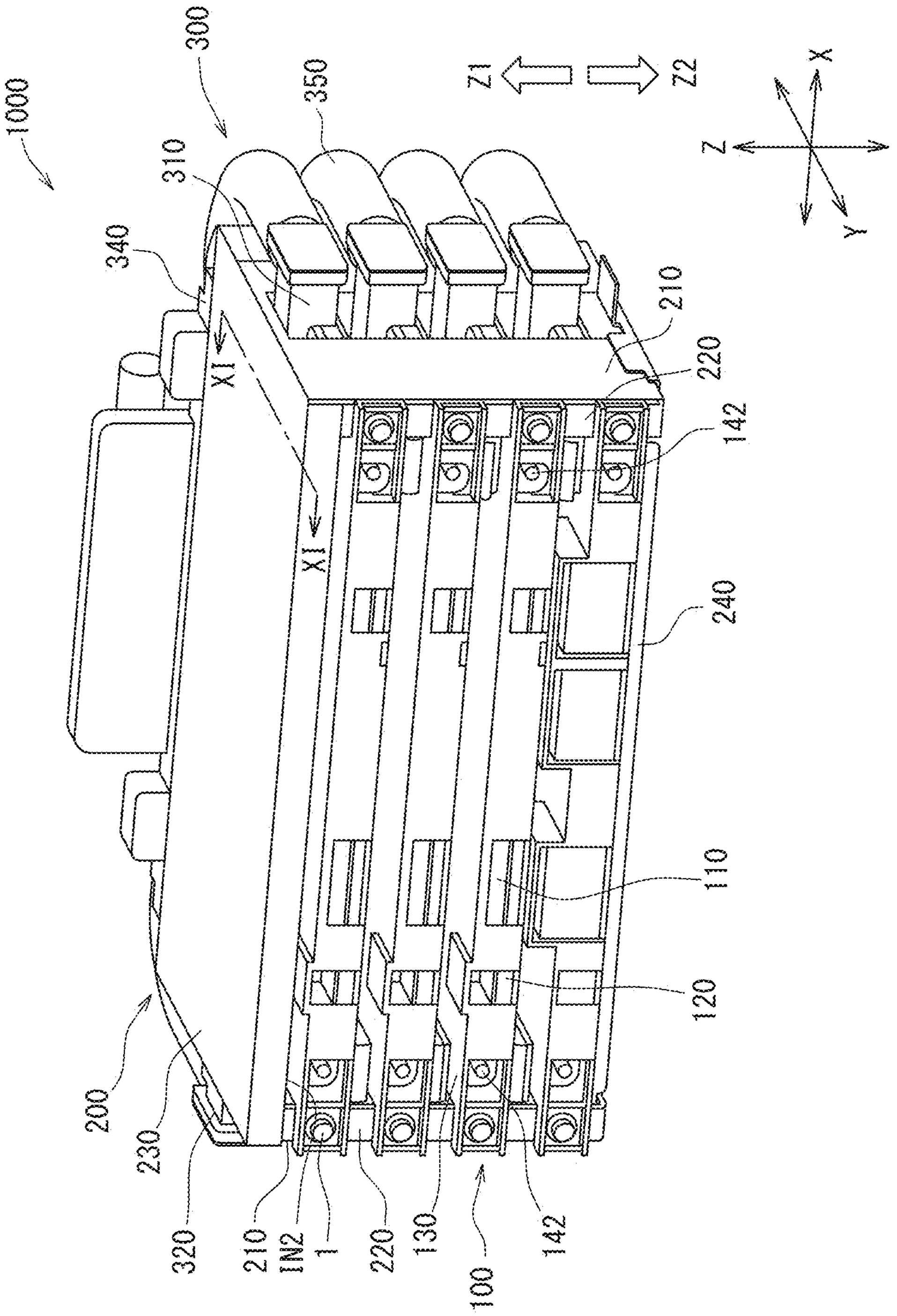
FIG. 1 is a perspective view showing a schematic configuration of an electronic control unit.

As a structure of an electronic control unit, it is conceivable to include an electronic device, a rack to which the electronic device is installed, and a cooling plate provided on the rack. In such an electronic control unit, there is a fear that a distance between the electronic device and the cooling plate will be increased when the electronic device is inserted into the rack. As a result, cooling efficiency of the electronic device by the cooling plate will be degraded. Further improvements are required in electronic control units in the above respects and in other respects not mentioned above.

The present disclosure provides an electronic control unit which is capable of improving cooling efficiency of an electronic device.

According to an aspect of the present disclosure, an electronic control unit includes a rack, an electronic device, a cooling plate, and a movable member. The electronic device is installable to the rack along an installation direction orthogonal to a thickness direction of the electronic device. The cooling plate is disposed in the rack and is movable in the thickness direction of the electronic device. The movable member is disposed in the rack at a position to interpose the electronic device in a direction orthogonal to the installation direction and the thickness direction. The movable member holds the cooling plate to be movable in the thickness direction. The movable member has a protrusion protruding toward the electronic device. The electronic device includes a pair of guide members disposed at ends in the direction orthogonal to the installation direction and the thickness direction. Each of the guide members includes a guide groove to receive the protrusion of the movable member therein. The guide groove extends along the installation direction and has an open end on a leading side in the installation direction. The guide member has an inclined portion, as a part of the guide groove, inclined relative to the installation direction, and a holding portion to hold the protrusion at an end of the guide groove opposite to the open end in the installation direction. The guide groove is configured to guide the protrusion from the inclined portion toward the holding portion after the electronic device is placed in a placement position facing the cooling plate during installation to the rack. The electronic device is configured to cause the movable member to be pulled toward the electronic device in the thickness direction in accordance with the movement of the protrusion from the inclined portion toward the holding portion, so that the electronic device placed in the placement position is brought to a mounting state mounted on the rack.

In such a configuration, when the electronic device is installed to the rack, the electronic device can attract the cooling plate to which the movable member is fixed to be closer to the electronic device. That is, in the electronic control unit, the electronic device and the cooling plate can be made closer to each other. Accordingly, the cooling efficiency of the electronic device can be improved in the electronic control unit.

The disclosed aspects in this specification adopt different technical solutions from each other in order to achieve their respective objectives. Objectives, features, and advantages of the present disclosure will become apparent by referring to following detailed descriptions and accompanying drawings.

An embodiment for implementing the present disclosure is hereinafter described with reference to the drawings. Hereinafter, three directions orthogonal to each other are denoted as X direction, Y direction, and Z direction. One of the X directions is referred to as a first outward direction X1, and the other of the X directions is referred to as a second outward direction X2. One of the Y directions is referred to as an installation direction Y1 and the other of the Y directions is referred to as a removal direction Y2. One of the Z directions is referred to as an upward direction Z1 and the other of the Z direction is referred to as a downward direction Z2.

The Z direction is orthogonal to the installation direction Y1 and corresponds to a thickness direction of the electronic device 100. The Y direction corresponds to a thickness direction of the base substrate 600. The X direction can also be referred to as a left-right direction. In this case, the first outward direction X1 can be referred to as a rightward direction, and the second outward direction X2 can be referred to as a leftward direction. The thickness direction of the base substrate 600 is the same as an insertion direction of an inter-board connector 611 and an inter-board connector 113.

<Electronic Control Unit>

An overall configuration of an electronic control unit 1000 will be described with reference to FIGS. 1 to 3. As shown in FIGS. 1 and 3, the electronic control unit 1000 includes an electronic device 100, a thermally conductive member 150, a rack 200, a cooling member 300, movable members 410 and 420, a positioning structure 500 (positioning member 510), a base substrate 600, and the like.

The electronic control unit 1000 is configured to be mountable on a moving object such as a vehicle. The vehicle may be, for example, a gasoline vehicle, a diesel vehicle, a hybrid vehicle, an electric vehicle, a fuel cell vehicle, or the like. The moving object may be a flying object other than the vehicle.

Each electronic device 100 may have a function as a control device. The electronic control unit 1000 can be referred to as a collective control unit, a control device aggregate, or the like.

In the electronic control unit 1000, multiple electronic devices 100 are stacked in the Z direction. In the following description, of any two electronic devices 100 arranged adjacent to each other in the Z direction, the upper electronic device 100 is referred to as the upper electronic device, and the lower electronic device 100 is referred to as the lower electronic device. That is, of the two electronic devices 100, the electronic device 100 arranged higher than the other in the upward direction Z1 is the upper electronic device, and the electronic device 100 arranged lower than the other in the downward direction Z2 is the lower electronic device.

The multiple electronic devices 100 are configured to be installable to a rack 200. Also, the multiple electronic devices 100 are configured to be removable from the rack 200. The multiple electronic devices 100 are mounted on the rack 200 by being moved in the installation direction Y1. In other words, the multiple electronic devices 100 are installed in the rack 200 by being inserted into the rack 200. The multiple electronic devices 100 are removed from the rack 200 by being moved in the removal direction Y2. In other words, the electronic devices 100 are configured to be replaceable.

The electronic device 100 may also be referred to as a replaceable ECU. ECU is an abbreviation for Electronic Control Unit.

The multiple electronic devices 100 are electrically connected to the base substrate 600 in a state of being mounted on the rack 200. The multiple electronic devices 100 are mounted on the base substrate 600 in a direction orthogonal to the base substrate 600. Note that the term orthogonal herein includes a relationship in which each electronic device 100 and the base substrate 600 are not orthogonal to each other to the extent of error. In other words, the orthogonal herein is not only perfectly orthogonal but also generally orthogonal including an error. Therefore, it can be said that the multiple electronic devices 100 are mounted in a direction substantially orthogonal to the base substrate 600.

The state in which the electronic device 100 is mounted on the rack 200 is referred to as a mounting state. In the mounting state, the electronic device 100 is secured to the rack 200. In the mounting state, the cooling plate 330, which will be described later, has been moved in the downward direction Z2. Furthermore, in the mounting state, the thermally conductive member 150 is in a state of being compressed by the electronic device 100 and the cooling plate 330.

A state in which the electronic device 100 is simply inserted into the rack 200 is referred to as an insertion state. In the insertion state, the cooling plate 330 has not been moved in the downward direction Z2. A state in which the electronic device 100 is not mounted on the rack 200 is referred to as a non-mounting state or removal state. In the non-mounting state, the electronic device 100 is not inserted into the rack 200. The electronic device 100 will be described in detail later.

As shown in FIG. 3, the rack 200 includes rack side parts 210, a rack front part 220, a rack top part 230, a rack bottom part 240, a rack back part 250, and the like. Furthermore, the rack 200 includes a holding member 260.

In the rack 200, the rack side parts 210, the rack front part 220, and the rack back part 250 forms a frame. In the rack 200, the rack top part 230 and the rack bottom part 240 are disposed at the upper and lower sides of the frame as covers. The rack top part 230 and the rack bottom part 240 are fixed to the frame by means of screws, welding or the like. The rack 200 provides an insertion space IN1, in which the electronic devices 100 are placed, by the frame, the rack top part 230, and the rack bottom part 240.

The rack side part 210 has two Z-direction side portions extending along the Z direction and a Y-direction side portion extending along the Y direction and connecting the Z-direction side portions. The Z-direction side portions and the Y-direction side portion are fixed by means of screws, welding, or the like. The rack side parts 210 are provided in a pair in the X direction so as to interpose the electronic devices 100 therebetween. Furthermore, part of the cooling member 300 is placed between the two Z-direction side portions.

The holding member 260 is fixed to the rack side part 210. The holding member 260 is a part that holds the movable member 410, 420 so that the movable member 410, 420 is movable in the Z direction. In other words, the movable member 410, 420 is configured to be movable in the Z direction relative to the holding member 260. Moreover, the movable members 410 and 420 are fixed to the cooling plate 330 of the cooling member 300. Therefore, it can be said that the holding member 260 is the part that holds the cooling plate 330 so that the cooling plate 330 is movable in the Z direction. The cooling plate 330 is movable in the Z direction together with the movable members 410 and 420.

The holding member 260 is provided individually for each electronic device 100. The movable members 410 and 420 are provided individually for each electronic device 100. The holding member 260 and the movable members 410 and 420 will be described in detail later.

The rack front part 220 has two Z-direction front portions extending along the Z direction, and an X-direction front portion extending along the X direction and connecting the Z-direction front portions. The Z-direction front portions and the X-direction front portion are fixed by means of screws, welding, or the like. In addition, an insertion opening IN2 for allowing the insertion of the electronic devices 100 is formed between the two Z-direction front portions.

The rack back part 250 has two Z-direction back portions extending along the Z direction and two X-direction back portions extending along the X direction and connecting the Z-direction back portions. The Z-direction back portion and the X-direction back portion are fixed by means of screws, welding, or the like. Further, a part of the positioning structure 500 is placed in the opening surrounded by the two Z-direction back portions and the two X-direction back portions.

Figure 12:
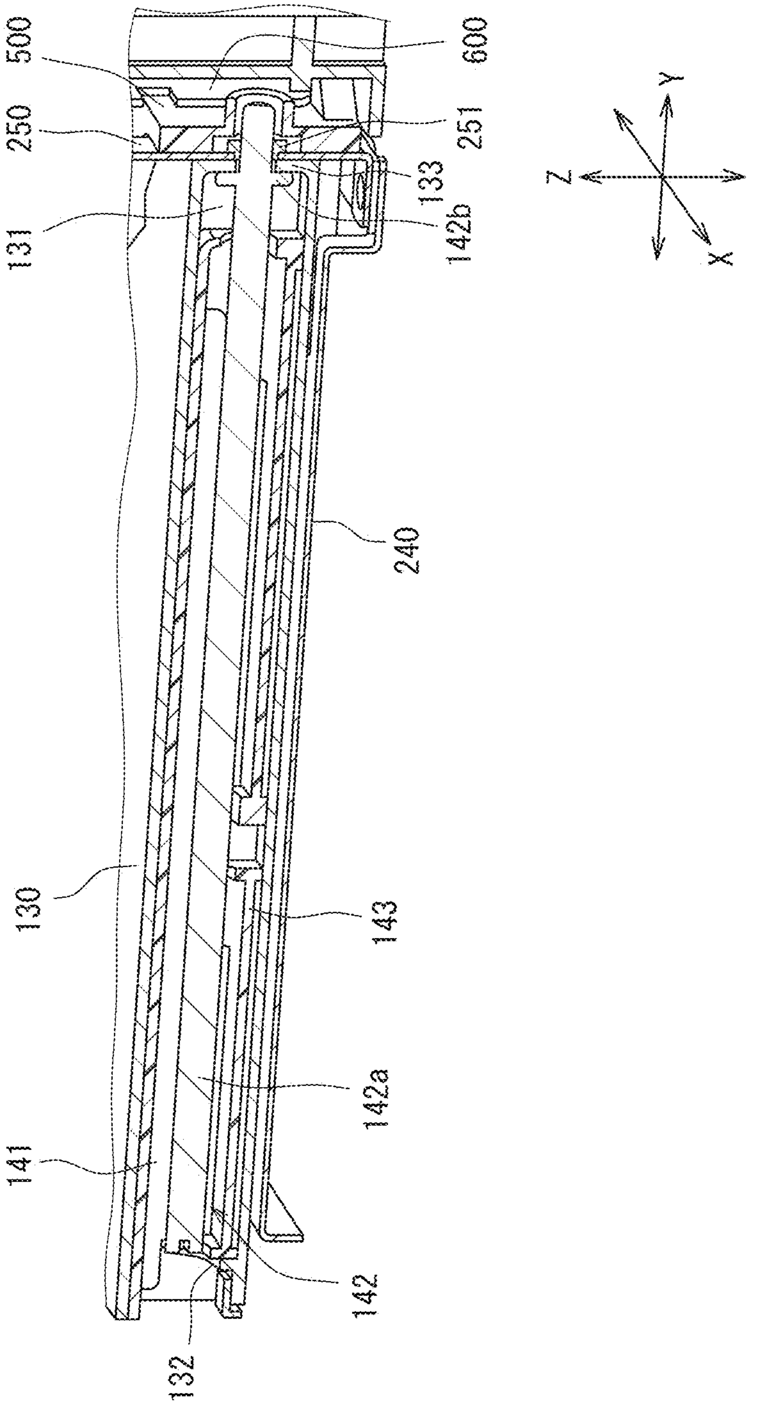
FIG. 12 is a cross-sectional view showing a schematic configuration of the slide member.

As shown in FIG. 12, the rack back part 250 is provided with a fixing portion 251 for fixing a push-back member 142. The fixing portion 251 is formed with a female thread that engages with a male thread formed at the tip of the push-back member 142. The push-back member 142 will be described in detail later.

The rack 200 has a four-tier structure capable of accommodating four electronic devices 100. However, the rack 200 may be configured to accommodate five or more electronic devices 100. Alternatively, the rack 200 may be configured to accommodate three or less electronic devices 100. For example, the rack 200 may be configured to accommodate only one electronic device 100. Namely, the electronic control unit 1000 may be configured as a unit that has multiple electronic devices 100 or a unit that has only one electronic device 100.

Figure 2:
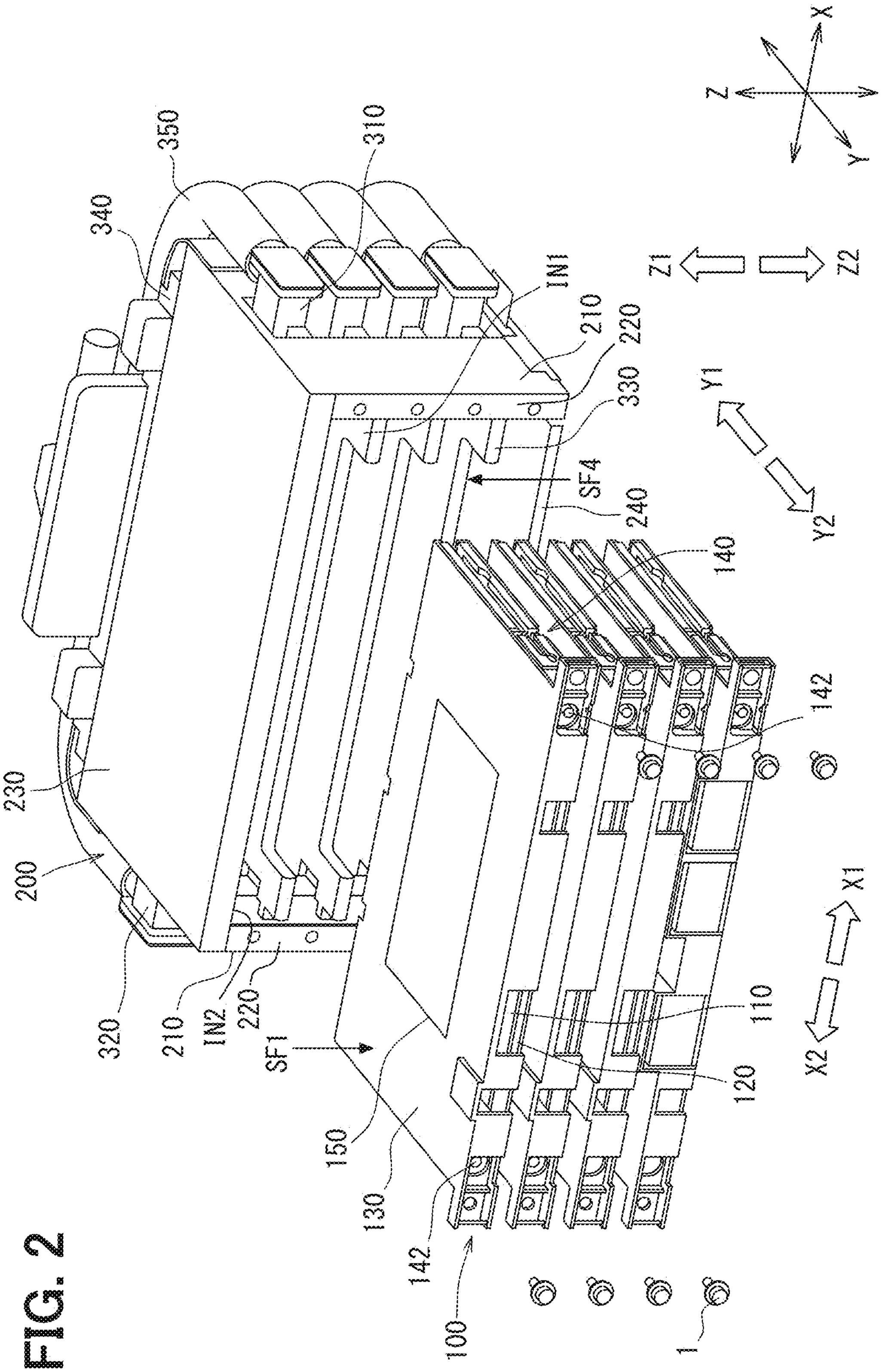
FIG. 2 is a perspective view showing a state in which the electronic device is removed from the electronic control unit.
Figure 3:
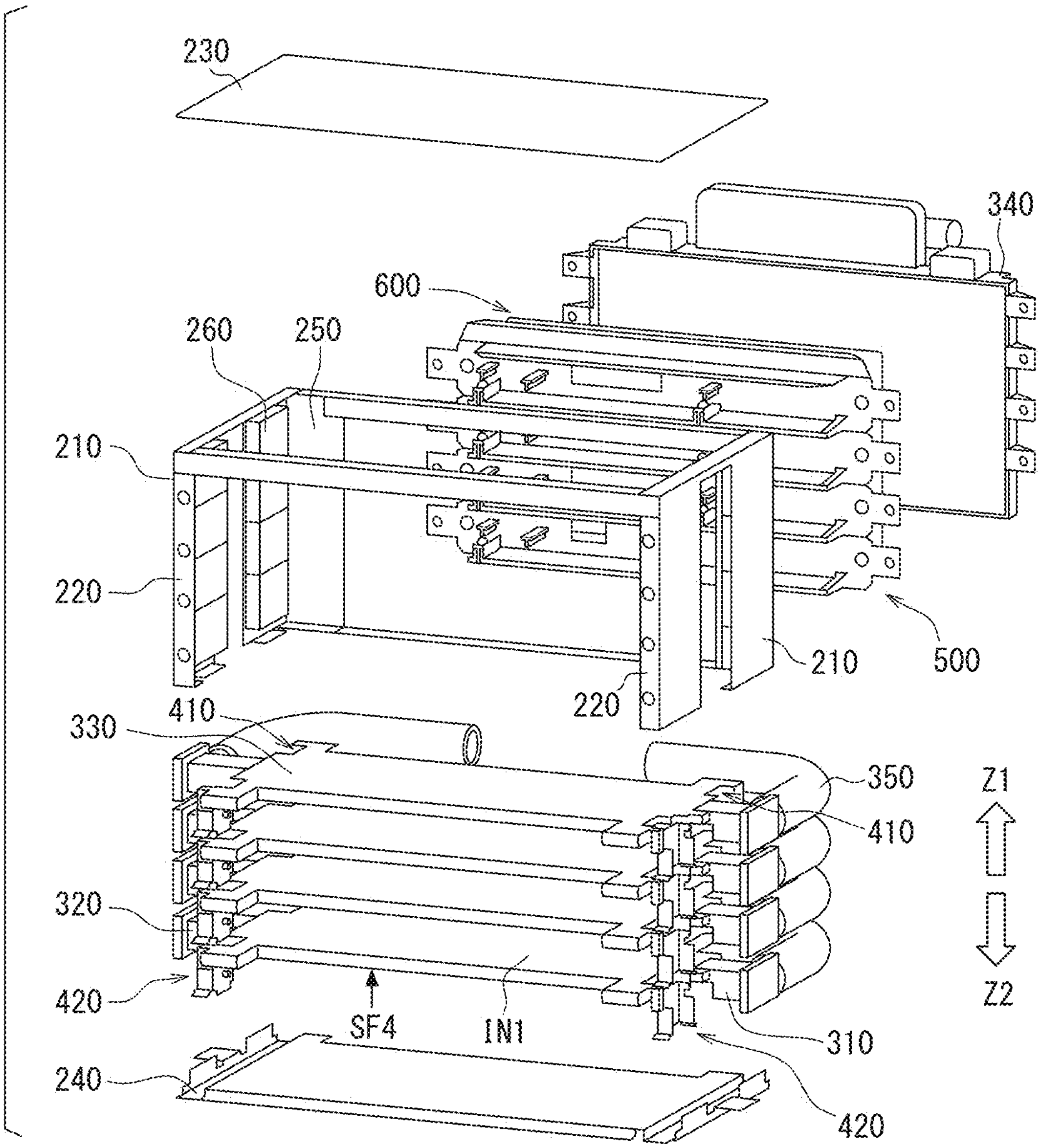
FIG. 3 is an exploded perspective view showing a schematic configuration of the electronic control unit.

As shown in FIGS. 2 and 3, the cooling member 300 includes an inlet portion 310, an outlet portion 320, the cooling plate 330, a rear portion 340, a cooling hose 350, and the like. The cooling member 300 is provided to cool the electronic device 100. The cooling member 300 mainly cools a heat generating component 112 of the electronic device 100.

The cooling plate 330 is provided individually for each electronic device 100. The cooling member 300 includes four cooling plates 330. The four cooling plates 330 are stacked in the Z direction. One electronic device 100 is disposed in a space defined between the cooling plates 330. Note that the space defined between the cooling plates 330 refers to the space defined between any two cooling plates 330 adjacent to each other in the Z direction.

However, the number of cooling plates 330 is not limited to four. The cooling member 300 may include the same number of cooling plates 330 as the number of electronic devices 100 that can be accommodated in the rack 200.

The cooling member 300 mainly cools the electronic device 100 by using the cooling plate 330. The cooling plate 330 is mainly made of a metal having high thermal conductivity, such as aluminum. The cooling plate 330 has a refrigerant space formed therein through which a liquid refrigerant such as cooling water flows.

The electronic device 100 to be cooled is disposed below the cooling plate 330 in the downward direction Z2 to face the lower surface of the cooling plate 330. In the electronic control unit 1000, therefore, the cooling plate 330 and the electronic device 100 to be cooled are arranged in this order in the downward direction Z2. That is, the corresponding electronic device 100 to be cooled is arranged below the cooling plate 330. In other words, the cooling plate 330 is arranged in a direction opposite to the direction of gravity relative to the electronic device 100 to be cooled. This arrangement restricts the cooling plate 330 from forming an air layer between the liquid refrigerant and the electronic device 100.

As shown in FIG. 2, the surface of the cooling plate 330 facing in the downward direction Z2 is a facing surface SF4. On the other hand, the surface of the electronic device 100 facing the cooling plate 330 is a facing surface SF1. The facing surface SF1 is the surface of the electronic device 100 facing in the upward direction Z1. Therefore, in the mounting state, the electronic device 100 and the cooling plate 330 are disposed such that the facing surfaces SF1 and SF4 face each other. The facing surfaces SF1 and SF4 are, for example, flat surfaces.

The cooling plate 330 has the inlet portion 310 on one side in the X direction and the outlet portion 320 on the other side in the X direction. The liquid refrigerant flows into the refrigerant space from the inlet portion 310. The liquid refrigerant flows through the refrigerant space and flows out from the outlet portion 320. The positional relationship between the inlet portion 310 and the outlet portion 320 may be reversed.

The inlet portion 310 and the outlet portion 320 each define a refrigerant flow path through which the liquid refrigerant flows. Cooling hoses 350 defining the refrigerant flow paths are coupled to the inlet portion 310 and the outlet portion 320.

The cooling hoses 350 are coupled to the inlet portion 310 and the outlet portion 320 of each cooling plate 330. The cooling hose 350 has one end coupled to the inlet portion 310 or the outlet portion 320 and the other end coupled to the rear portion 340. The rear portion 340 has a refrigerant flow path through which the liquid refrigerant supplied to the cooling plate 330 flows, and a refrigerant flow path through which the liquid refrigerant discharged from the cooling plate 330 flows.

As shown in FIG. 3, the cooling plate 330 has the movable members 410 and 420 attached to its four corners. The movable members 410 and 420 are attached to the cooling plate 330 at the front and rear ends in the Y direction, on both sides in the X direction. The movable members 410 and 420 are fixed to the cooling plate 330 by means of screws, welding, or the like.

As described above, the cooling plate 330 is configured to be movable in the Z direction. In other words, the cooling plate 330 is movable in the Z direction relative to the rack 200 (holding member 260). Thus, it can be said that the cooling plate 330 is mounted on the rack 200 in a state in which the cooling plate 330 is movable in the thickness direction Z, which is orthogonal to the installation direction Y1 of the electronic device 100. Therefore, the cooling hose 350 is made of a deformable material such as rubber.

The movable members 410 and 420 are attached to the rack 200 at positions that interpose the electronic device 100 therebetween. The movable members 410 and 420 have protrusions 417 and 427 that protrude toward the electronic device 100, respectively. The movable members 410 and 420 will be described in detail later.

As shown in FIGS. 2 and 3, the rear portion 340 of the cooling member 300 is placed on the back side of the rack 200 in the installation direction Y1. The rear portion 340 is attached to the rack 200 in a state where the positioning member 510 and the base substrate 600 are disposed between the rear portion 340 and the rack back part 250.

The positioning members 510 are placed between the base substrate 600 and the multiple electronic devices 100. The positioning member 510 is a member for positioning the inter-board connector 611 of the base substrate 600 and the inter-board connector 113 of the electronic device 100. The positioning member 510 and the base substrate 600 will be described in detail later. Note that the electronic control unit 1000 may not include the positioning member 510 and the base substrate 600. The inter-board connector 611 corresponds to a first connector. The inter-board connector 113 corresponds to a second connector.

As shown in FIG. 2, the thermally conductive member 150 is in a state of being in contact with the electronic device 100 in the non-mounting state and the insertion state. In other words, the thermally conductive member 150 is not in contact with the cooling plate 330 in the non-mounting state and in the insertion state. The thermally conductive member 150 is provided individually for each electronic device 100. The thermally conductive member 150 is also referred to as a thermal interface material (TIM).

The thermally conductive member 150 is placed between the electronic device 100 and the cooling plate 330 in the mounting state. Further, the thermally conductive member 150 is in contact with the cooling plate 330 in the mounting state. Thus, the thermally conductive member 150 is placed in a state of being in contact with the facing surfaces SF1 and SF4. In the mounting state, the thermally conductive member 150 is pressed (compressed) by the electronic device 100 and the cooling plate 330. The thermally conductive member 150 is placed between the cooling plate 330 and the electronic device 100 to be cooled by the cooling plate 330.

The thermally conductive member 150 is a member that facilitates heat transfer from the electronic device 100 to the cooling plate 330. The thermally conductive member 150 can also be regarded as a member for lowering the thermal resistance between the electronic device 100 and the cooling plate 330. The thermally conductive member 150 is an elastically deformable sheet-shaped member. The thermally conductive member 150 may also be a gel, grease, or the like. The thermally conductive member 150 will be described in detail later.

<Electronic Device>

Figure 4:
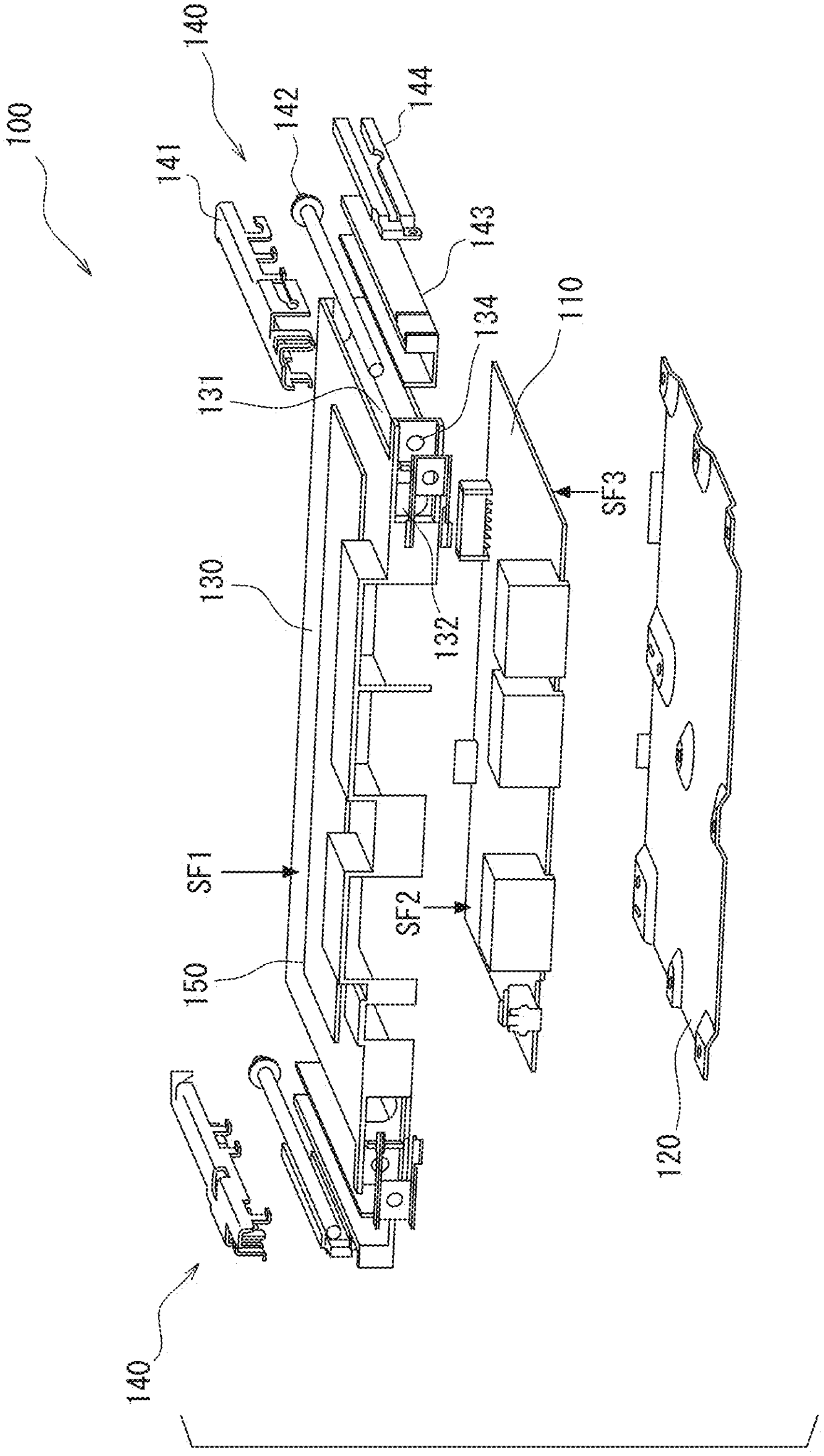
FIG. 4 is an exploded perspective view showing a schematic configuration of the electronic device.
Figure 5:
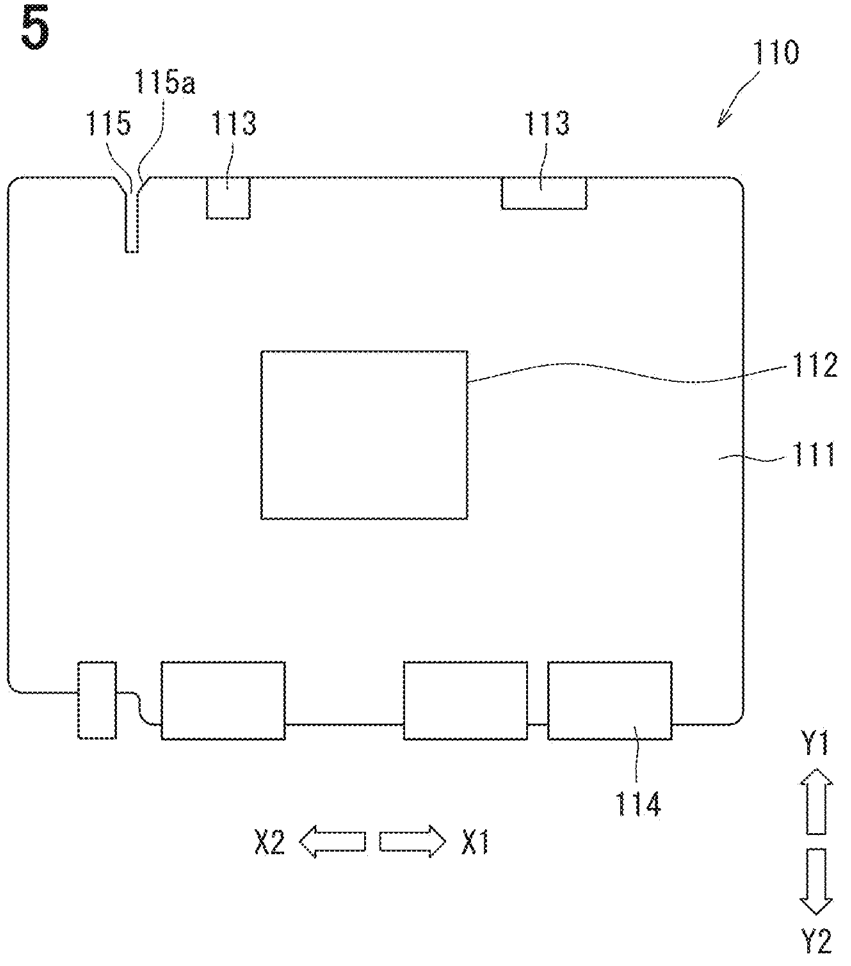
FIG. 5 is a plan view showing a schematic configuration of a circuit board.

The electronic device 100 will be described with reference to FIGS. 4 to 8. The electronic devices 100 have a similar configuration to each other. However, the electronic devices 100 have different circuit configurations or difference processing contents. As shown in FIGS. 4 and 5, the electronic device 100 includes the circuit board 110 and the case that accommodates the circuit board 110 therein.

The circuit board 110 includes a wiring board 111, a heat generating component 112 as an electronic component, the inter-board connector 113, an external connector 114, and the like. The wiring board 111 has an electrically insulating base material, such as resin, and conductive wirings disposed on the base material. The wiring board 111 has a first surface SF2 and a second surface SF3 opposite to the first surface SF2. The wiring board 111 is a so-called printed circuit board. In the mounting state, the wiring board 111 is placed along an XY plane. The XY plane is a plane including an X-axis extending in the X direction and a Y-axis extending in the Y direction.

Circuit elements including the heat generating component 112 are mounted on the wiring board 111. The circuit elements are electrically connected to the wirings of the wiring board 111. The heat generating component 112 is a circuit element that generates heat when in operation. The heat generating component 112 is a system on a chip (SoC) or a semiconductor switching element, such as a metal oxide semiconductor field effect transistor (MOSFET) or an insulated gate bipolar transistor (IGBT). Circuit elements other than the heat generating component 112 may be mounted on the wiring board 111.

For example, the heat generating component 112 is mounted on the surface of the wiring board 111 on a side adjacent to the facing surface SF1. Such a configuration is preferable to efficiently cool the heat generating component 112.

The inter-board connector 113, which is used for electrical connection with the base substrate 600, is mounted on the wiring board 111. The inter-board connector 113 is electrically connected to the wirings and the circuit elements of the wiring board 111. The inter-board connector 113 is electrically connected to the inter-board connector 611 of the base substrate 600. The inter-board connectors 113 and 611 are also referred to as board-to-board connectors (BtoB). The inter-board connectors 113 and 611 are electrically connected to each other in a way of one being inserted into the other.

The inter-board connectors 113 and 611 may be, for example, floating connectors. In this case, at least one of the inter-board connectors 113 and 611 has a floating mechanism that is movable in two directions orthogonal to the connection direction. This allows the inter-board connectors 113 and 611 to absorb any misalignment that may occur when they are connected. The direction of connection of the inter-board connectors 113 and 611 corresponds to the Y direction.

An external connector 114, which is used for electrical connection with an external device provided outside the electronic control unit 1000, is mounted on the wiring board 111. The external connector 114 is electrically connected to the wirings and the circuit elements of the wiring board 111.

The wiring board 111 is formed with a positioning slit 115. The positioning slit 115 is provided for positioning the inter-board connectors 113 and 611 in the X direction. The positioning slit 115 corresponds to a second positioning hole.

At least in the mounting state, a first positioning part 530 of the positioning member 510 is placed in the positioning slit 115. When the electronic device 100 is moved in the installation direction Y1, the first positioning part 530 of the positioning member 510 is gradually received in the positioning slit 115.

The positioning slit 115 extends along the planar direction of the wiring board 111. The positioning slit 115 defines a hole that penetrates the wiring board 111 in the thickness direction (Z direction). The positioning slit 115 has an opening in one of the side walls of the wiring board 111. The positioning slit 115 can also be regarded as a cutout formed to extend along the installation direction Y1. Further, the opening end of the positioning slit 115 is provided with a chamfered portion 115*a*. Therefore, the positioning member 510 can easily enter the positioning slit 115. The thickness direction of the wiring board 111 corresponds to the direction in which the thickness of the wiring board 111 is measured, and the thickness of the wiring board 111 is defined by the distance between the first surface SF2 and the second surface SF3. The planar direction of the wiring board 111 is the same as the insertion direction of the inter-board connector 611 and the inter-board connector 113.

Figure 6:
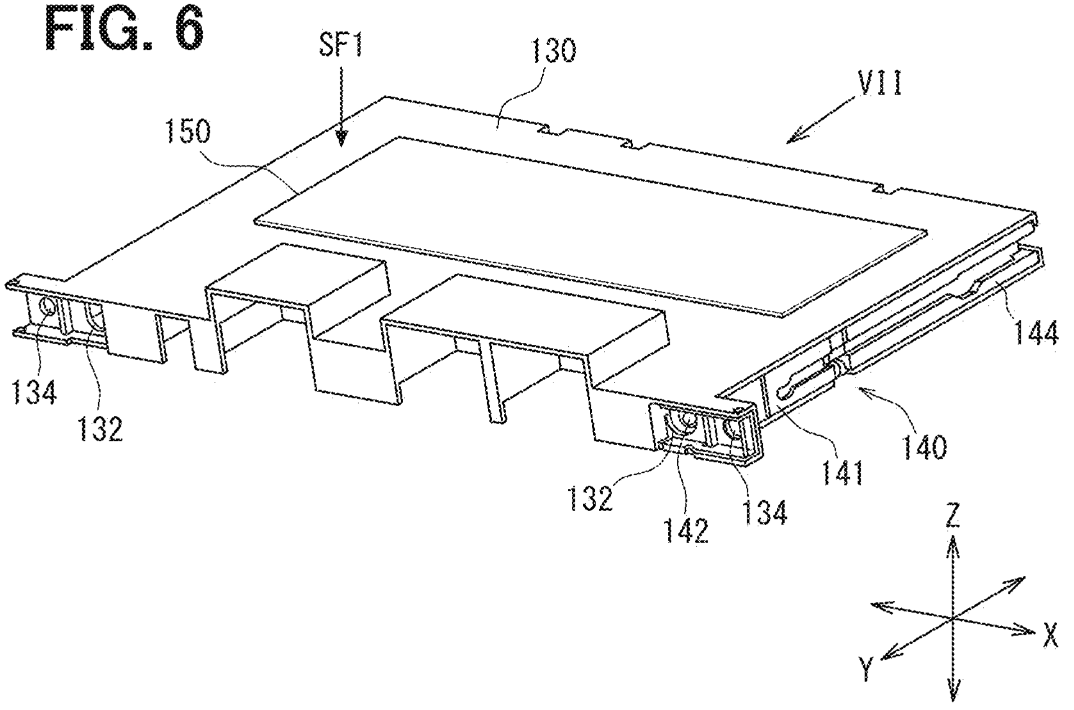
FIG. 6 is a perspective view showing a schematic configuration of a case.
Figure 7:
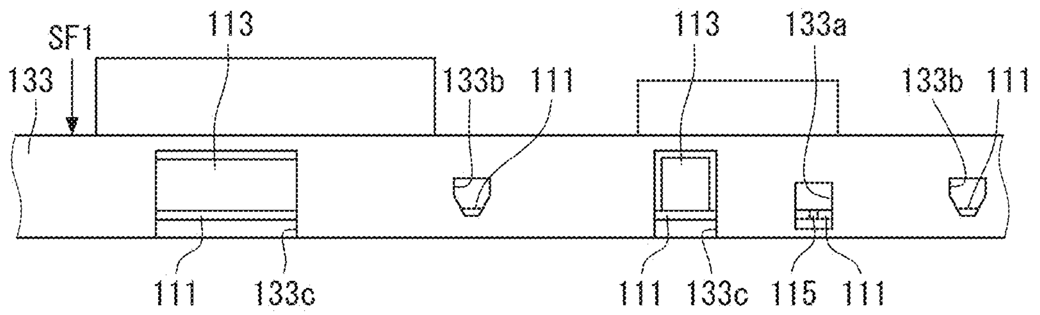
FIG. 7 is a side view showing a schematic configuration of a back part of the case.

As shown in FIGS. 4, 6 and 7, the case includes a base 120 on which the circuit board 110 is mounted, and a cover that covers the circuit board 110. The circuit board 110 is fixed to the base 120 by means of screws, adhesive, or the like. When the base 120 and the cover are assembled, the case defines an accommodation space for accommodating the circuit board 110 therein. The base 120 and the cover are fixed together by means of screws, adhesive, or the like. The case corresponds to a housing.

The cover includes a case upper portion 130, a guide holding portion 131, a removal opening portion 132, a case back portion 133, and a screw hole 134. The cover has a recessed shape so as to cover the circuit board 110. The case upper portion 130 is disposed to face the first surface SF2 of the wiring board 111. The base 120 is disposed to face the second surface SF3 of the wiring board 111.

Figure 8:
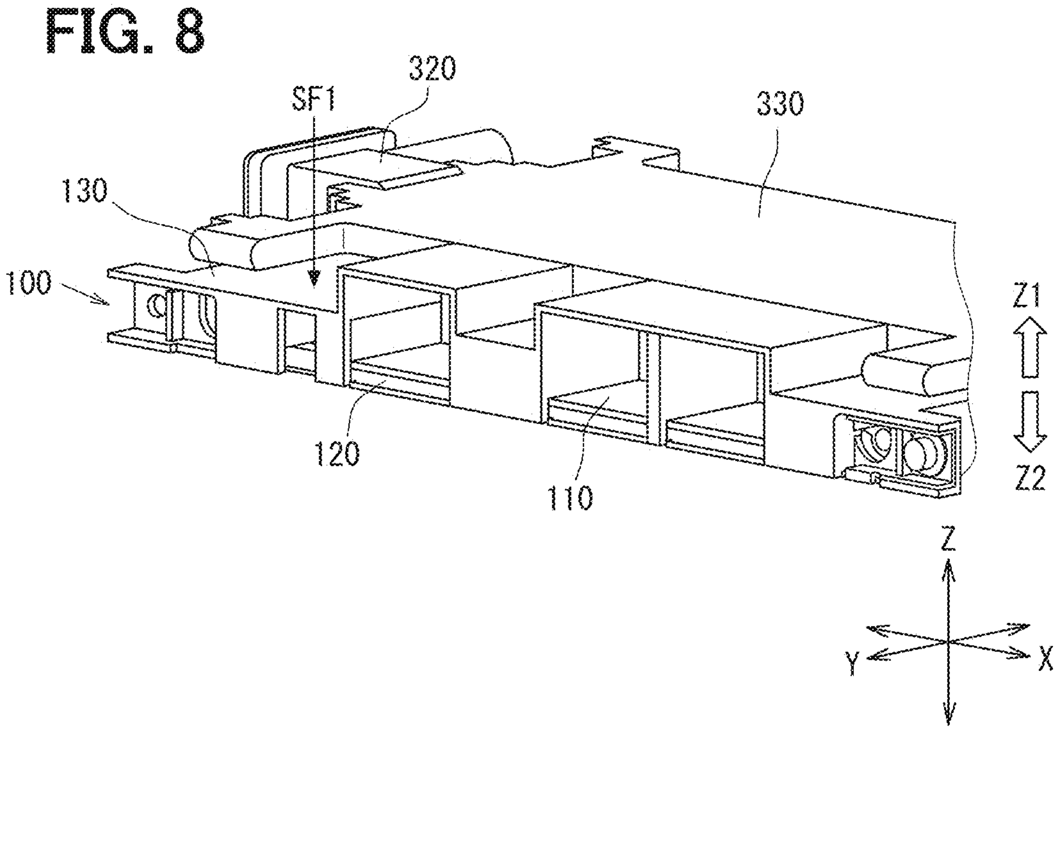
FIG. 8 is a perspective view showing a schematic configuration of the electronic device and a cooling plate.

The case upper portion 130 includes a portion facing the heat generating component 112. The surface of the case upper portion 130 provides the facing surface SF1. As shown in FIG. 8, in the mounting state, the cooling plate 330 is placed above the facing surface SF1 of the electronic device 100.

As shown in FIGS. 4 and 6, the guide holding portion 131 is provided at a position continuous with the case upper portion 130. The guide holding portion 131 is provided at each of the ends of the cover in the X direction. The guide holding portion 131 forms a side wall of the cover along the Y direction. The guide holding portion 131 provides a groove in which the slide member 140 is placed. The slide members 140 are disposed at both ends of the electronic device 100 in the X direction. The guide holding portion 131 can also be referred to as a slide holding portion.

The slide member 140 includes a slider 141. Therefore, it can be said that the slider 141 is disposed in the guide holding portion 131. The slide member 140 will be described in detail later.

The removal opening portion 132 is provided at an end of the guide holding portion 131 in the Y direction. The removal opening portion 132 defines an opening for exposing the push-back member 142 of the slide member 140. In other words, the removal opening portion 132 is provided so that one end of the push-back member 142 is exposed to the outside of the cover.

As shown in FIG. 7, the case back portion 133 is a side wall on the back side in the Y direction. The case back portion 133 is continuous to the case upper portion 130. FIG. 7 shows a state in which the circuit board 110 is accommodated in the case.

The case back portion 133 is provided with a first opening 133*a*, a second opening 133*b*, and a connection opening 133*c*. Each of the openings 133*a* to 133*c* is a through hole that penetrates the case back portion 133 in a plate thickness direction of the case back portion 133. Therefore, in FIG. 7, the wiring board 111 is visible through each of the openings 133*a* to 133*c*.

The first opening 133*a* defines an opening in which the first positioning part 530 of the positioning member 510 is placed at least in the amounting state. The first opening 133*a* defines the opening for receiving the first positioning part 530 of the positioning member 510, which is arranged outside the electronic device 100, on the accommodation space side.

The second opening 133*b* defines an opening in which a part of the second positioning part 540 is placed at least in the mounting state. The second opening 133*b* defines the opening for receiving a part of the second positioning part 540 of the positioning member 510, which is arranged outside the electronic device 100, on the accommodation space side.

The connection opening 133*c* defines an opening for connecting the inter-board connectors 113 and 611. In other words, the connection opening 133*c* provides a mechanism for connecting the inter-board connector 113 of the circuit board 110 arranged in the accommodation space and the inter-board connector 611 of the base substrate 600 arranged outside the electronic device 100 to each other. In the mounting state, at least one of the inter-board connector 113 or the inter-board connector 611 is placed in the connection opening 133*c*.

The screw hole 134 defines a hole into which the fixing screws 1 for fixing the electronic device 100 to the rack 200 is inserted. In the mounting state, the electronic device 100 is fixed to the rack 200 by means of the fixing screw 1 and the push-back member 142. However, the method of fixing the electronic device 100 to the rack 200 is not limited to this example.

<Slide Member>

The slide member 140 will be described with reference to FIGS. 4, 6, and 9 to 12. As shown in FIGS. 4 and 6, the slide members 140 are disposed in a pair at opposite ends of the cover in the X direction. That is, the electronic device 100 has two slide members 140. The electronic device 100 is provided with a pair of slide members 140 one being placed on a first end, which is on a side in the first outward direction X1, and the other being placed on a second end, which is on a side in the second outward direction X2.

Figure 9:
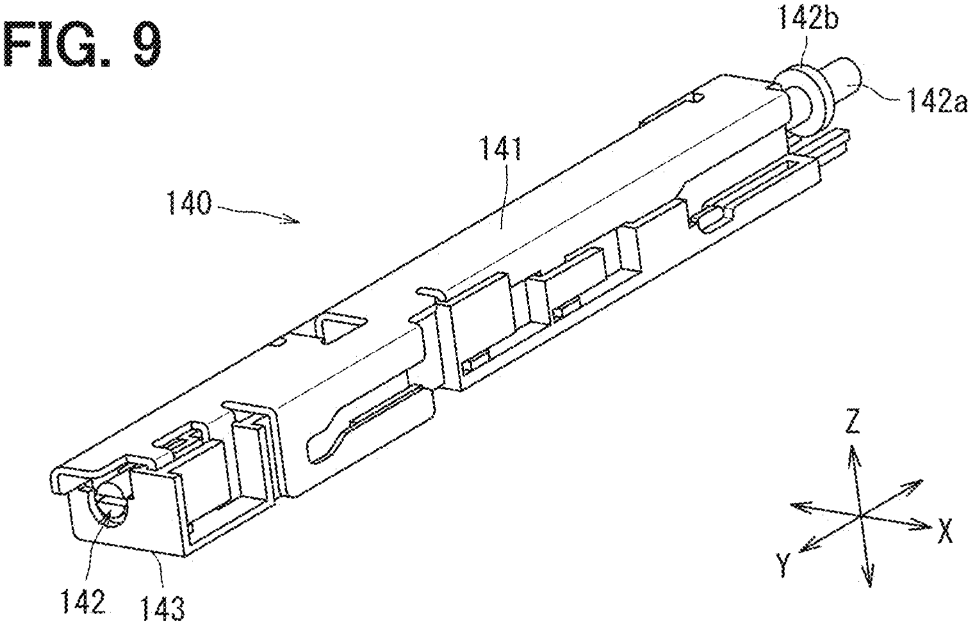
FIG. 9 is a perspective view showing a schematic configuration of a slide member.
Figure 10:
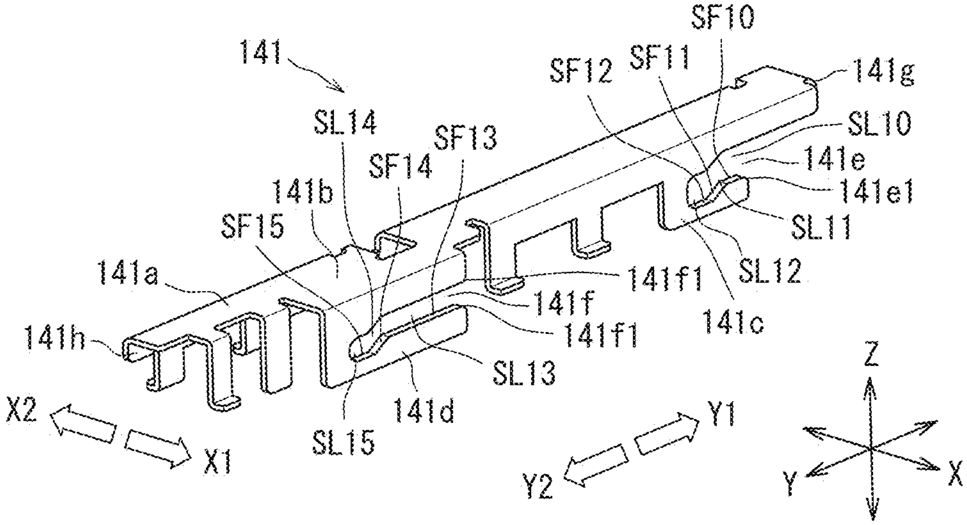
FIG. 10 is a perspective view showing a schematic configuration of a slider.
Figure 11:
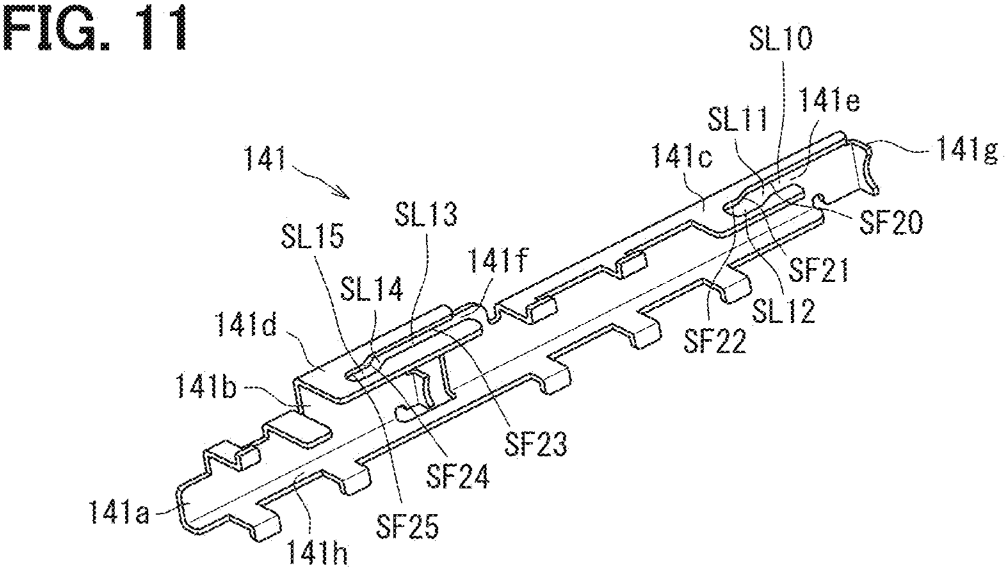
FIG. 11 is a perspective view showing a schematic configuration of a slider.

The slide member 140 includes the slider 141, the push-back member 142, a slider holder 143, a slider cover 144, and the like. The slider 141 corresponds to a guide member. In FIGS. 9 to 11, the slider 141 placed at the first end in the first outward direction X1 of the electronic device 100 is shown. That is, FIGS. 9 to 11 show the slider 141 placed on the right side of the electronic device 100.

As shown in FIG. 9, the slider 141 is attached to the slider holder 143. The slider 141 is disposed in the guide holding portion 131 in the state of being attached to the slider holder 143. The slider cover 144 holds the slider 141 to restrict the slider 141 from coming off from the guide holding portion 131.

The slider 141 is configured to be movable in the installation direction Y1. The slider 141 is movable in the installation direction Y1 in a state of being disposed in the guide holding portion 131. Moreover, the slider 141 is movable in the Y direction relative to the slider holder 143 and the case (e.g., the case upper portion 130).

For example, the slider 141 is formed by pressing from a plate-like member, which is mainly made of a metal, as shown in FIGS. 10 and 11. The slider 141 mainly has side wall portions 141*c*, 141*d* and 141*h*, and a connecting portion 141*a* connecting the side wall portions 141*c* and 141*d* and the side wall portion 141*h*. The side wall portions 141*c* and 141*d* face the side wall portion 141*h* in the X direction. The side wall portions 141*c*, 141*d*, and 141*h* extend along the YZ plane. On the other hand, the connecting portion 141*a* is a portion extending along the XY plane. The YZ plane is a plane defined by the Y axis extending in the Y direction and the Z axis extending in the Z direction.

The side wall portions 141*c* and 141*d* are disposed at one end of the connecting portion 141*a* in the X direction. The side wall 141*h* is disposed at the other end of the connecting portion 141*a* in the X direction. Therefore, the side wall portions 141*c* and 141*d* are disposed to face the side wall 141*h* in the X direction.

The side wall portion 141*c* is located on the back side than the side wall portion 141*d* when the electronic device 100 is placed in the insertion space IN1. That is, the side wall portion 141*c* is located on a side adjacent to the back side of the rack 200, and the side wall portion 141*d* is located on a side adjacent to the front side of the rack 200. Further, it can be said that the side wall portion 141*c* is located on a leading side or a forward side than the side wall portion 141*d* in the installation direction Y1. In the electronic control unit 1000, since the electronic device 100 is installed in the rack 200 in the installation direction Y1 from the front side to the back side of the rack 200, the leading side or the forward side in the installation direction Y1 corresponds to the side adjacent to the back side of the rack 200, and a trailing side in the installation direction Y1 corresponds to the side adjacent to the front side of the rack 200.

The side wall portion 141*d* is continuous to the connecting portion 141*a* via an extension portion 141*b* that is provided at a part of the connecting portion 141*a*. The extension portion 141*b* is provided by a portion extended from the connecting portion 141*a* in the first outward direction X1. The extension portion 141*b* is provided in order to position the side wall portion 141*d* further in the first outward direction X1 than the side wall portion 141*c*. Therefore, the side wall portion 141*d* is located outside than the side wall portion 141*c* in the first outward direction X1. The distance between the side wall portion 141*h* and the side wall portion 141*d* in the X direction is larger than the distance between the side wall portion 141*h* and the side wall portion 141*c* in the X direction.

The slider 141 disposed on the left side has a similar configuration to the slider 141 disposed on the right side. The slider 141 disposed on the left side has the extension portion 141*b* to position the side wall portion 141*d* further in the second outward direction X2 than the side wall portion 141*c*. That is, the side wall portion 141*d* is located outside than the side wall portion 141*c* in the second outward direction X2.

The side wall portion 141*c* is formed with a guide groove 141*e* extending along the installation direction Y1. The side wall portion 141*d* is formed with a guide groove 141*f* extending along the installation direction Y1. The guide grooves 141*e* and 141*f* can be regarded as cutouts that penetrate the slider 141 in the plate thickness direction of the slider 141. The guide grooves 141*e* and 141*f* are grooves that respectively receive protrusions 417 and 427 of the movable members 410 and 420, which will be described later. The guide grooves 141*e* and 141*f* are grooves in which the protrusions 417 and 427 can move (slide). That is, the slider 141 is movable in the Y direction in the state where the protrusions 417 and 427 are disposed in the guide grooves 141*e* and 141*f*.

The guide grooves 141*e* and 141*f* each have an open end on the forward side in the installation direction Y1. In other words, the guide grooves 141*e* and 141*f* are grooves having openings 141*e*1 and 141*f*1 on the forward end, that is, on the leading end in the installation direction Y1, respectively. In the process of installing the electronic device 100 into the rack 200, the protrusions 417 and 427 enter the guide grooves 141*e* and 141*f* from the openings 141*e*1 and 141*f*1. The guide grooves 141*e* and 141*f* can also be regarded as guide slits or guide cutouts.

The side wall portions 141*c* and 141*d* are formed with the openings 141*e*1 and 141*f*1 whose opening widths increase in the installation direction Y1. In other words, the opening width of the guide grooves 141*e* and 141*f* of the slider 141 gradually increase toward their open ends. Therefore, the protrusions 417 and 427 can easily enter the guide grooves 141*e* and 141*f*.

The guide grooves 141*e* and 141*f* include inclined portions SL11 and SL14 inclined with respect to the installation direction Y1. The inclined portions SL11 and SL14 are inclined to be higher in the upward direction Z1 toward the installation direction Y1. That is, the inclined portions SL11 and SL14 are inclined to be closer to the connecting portion 141*a* toward the installation direction Y1. In other words, the inclined portions SL11 and SL14 are inclined so that portions on the leading side is located higher in the upward direction Z1 than portions on the trailing side. The inclined portions SL11 and SL14 are portions for attracting the cooling plate 330 toward the electronic device 100. In other words, the inclined portions SL11 and SL14 are portions for pulling the cooling plate 330 toward the electronic device

100 when the electronic device 100 is installed to the rack 200. Further, the inclined portions SL11 and SL14 are portions for separating the cooling plate 330 from the electronic device 100 when the electronic device 100 is removed from the rack 200. The functions of the guide grooves 141*e* and 141*f* will be described in detail later.

The guide grooves 141*e* and 141*f* include holding portions SL12 and SL15 at the ends opposite to the openings 141*e*1 and 141*f*1, that is, at the end on the trailing side in the installation direction Y1. The holding portions SL12 and SL15 are portions for holding the protrusions 417 and 427, respectively. As such, the guide grooves 141*e* and 141*f* are grooves that extend from the openings 141*e*1 and 141*f*1 to the holding portions SL12 and SL15, respectively.

The guide grooves 141*e* and 141*f* include flat portions SL10 and SL13 between the openings 141*e*1 and 141*f*1 and the inclined portions SL11 and SL14, respectively. The flat portions SL10 and SL13 extend along the installation direction Y1.

The guide grooves 141*e* and 141*f* will be described hereinafter in detail with reference to FIGS. 10 and 11. The slider 141 is formed with a first guide groove 141*e* and a second guide groove 141*f*, as the guide grooves. The first movable member 410, which will be described later, has a first protrusion 417. On the other hand, the second movable member 420 has a second protrusion 427. The first guide groove 141*e* is a groove in which the first protrusion 417 is received. The second guide groove 141*f* is a groove in which the second protrusion 427 is received.

The first guide groove 141*e* is formed in the side wall portion 141*c*. The flat portion SL10 is defined between first guide surfaces SF10 and SF20. The first guide surfaces SF10 and SF20 face each other in the Z direction and extend along the Y direction. The first guide surfaces SF10 and SF20 are, for example, flat surfaces. The opening width of the flat portion SL10 corresponds to the distance between the first guide surfaces SF10 and SF20 in the Z direction.

The inclined portion SL11 is defined between first inclined surfaces SF11 and SF21. The first inclined surfaces SF11 and SF21 face each other in the Z direction and are inclined with respect to the Y direction. The inclined portion SL11 is inclined in the upward direction Z1, that is, toward the connecting portion 141*a*, as it advances in the installation direction Y1. The opening width of the inclined portion SL11 corresponds to the distance between the first inclined surfaces SF11 and SF21.

The holding portion SL12 is defined between first holding surfaces SF12 and SF22. The first holding surfaces SF12 and SF22 face each other in the Z direction and extend along the Y direction. Further, the holding portion SL12 may include a surface connecting to the first holding surface SF12 and the first holding surface SF22. The surface connecting to the first holding surface SF12 and the first holding surface SF22 forms a bottom or closed end of the first guide groove 141*e*. The holding portion SL12 is located lower than the flat portion SL10 in the downward direction Z2.

The opening width of the holding portion SL12 corresponds to the distance between the first holding surfaces SF12 and SF22 in the Z direction. The opening widths of the flat portion SL10, the inclined portion SL11, and the holding portion SL12 correspond to the opening width of the first guide groove 141*e*.

The second guide groove 141*f* is formed in the side wall portion 141*d*. The flat portion SL13 is defined between second guide surfaces SF13 and SF23. The second guide surfaces SF13 and SF23 face each other in the Z direction and extend along the Y direction. The second guide surfaces SF13 and SF23 are, for example, flat surfaces. The opening width of the flat portion SL13 corresponds to the distance between the second guide surfaces SF13 and SF23 in the Z direction.

The inclined portion SL14 is defined between second inclined surfaces SF14 and SF24. The second inclined surfaces SF14 and SF24 face each other in the Z direction and are inclined with respect to the Y direction. The inclined portion SL14 is inclined in the upward direction Z1, that is, toward the connecting portion 141*a* as it advances in the installation direction Y1. The opening width of the inclined portion SL14 corresponds to the distance between the second inclined surfaces SF14 and SF24.

The holding portion SL15 is defined between second holding surfaces SF15 and SF25. The second holding surfaces SF15 and SF25 face each other in the Z direction and extend along the Y direction. Further, the holding portion SL15 may include a surface connecting to the second holding surface SF15 and the second holding surface SF25. The surface connecting to the second holding surfaces SF15 and SF25 forms a bottom or closed end of the second guide groove 141*f*. The holding portion SL15 is located lower than the flat portion SL13 in the downward direction Z2.

The opening width of the holding portion SL15 corresponds to the distance between the second holding surfaces SF15 and SF25. The opening widths of the flat portion SL13, the inclined portion SL14, and the holding portion SL15 correspond to the opening width of the second guide groove 141*f*.

The opening widths of the respective guide grooves 141*e* and 141*f* are set according to the diameters (thicknesses) of the protrusions 417 and 427, respectively. In other words, the opening width of each guide groove 141*e*, 141*f* is large enough to allow the corresponding protrusion 417, 427 to move therein. As will be described later, the first protrusion 417 is thicker than the second protrusion 427. Therefore, the opening width of the first guide groove 141*e* is larger than the opening width of the second guide groove 141*f*. Alternatively, if the thicknesses of the protrusions 417 and 427 are the same, the opening widths of the guide grooves 141*e* and 141*f* may be the same.

As described above, the side wall portion 141*c* is disposed on the leading side than the side wall portion 141*d* in the installation direction Y1. Therefore, when the electronic device 100 is installed to the rack 200, the first guide groove 141*e* is inserted into the insertion space IN1 before the second guide groove 141*f*.

The first guide groove 141*e* and the second guide groove 141*f* are provided at different positions in the Y direction. The first guide groove 141*e* is disposed on the leading side in the installation direction Y1 than the second guide groove 141*f*. Therefore, the first guide groove 141*e* can be regarded as a guide groove disposed on the back side, that is, on the leading side in the installation direction Y1. On the other hand, the second guide groove 141*f* can be regarded as a guide groove disposed on the front side, that is, on the trailing side in the installation direction Y1.

In this manner, the electronic device 100 has the two guide grooves 141*e* and 141*f* on the first end in the X direction, and the two guide grooves 141*e* and 141*f* on the second end in the X direction. With this configuration, the electronic device 100 cause the cooling plate 330 to move in the Z direction in a well-balanced manner. It can also be said that the electronic device 100 can move the cooling plate 330 while maintaining the parallel positional relationship between the facing surfaces SF1 and SF4.

An imaginary center line of the flat portion SL10 coincides with an imaginary center line of the flat portion SL13 in the Z direction. An imaginary center line of the holding portion SL12 coincides with an imaginary center line of the holding portion SL15 in the Z direction. Each imaginary center line is an imaginary straight line that passes through the center of each of the portions SL10, SL12, SL13, and SL15 in the Z direction and extends along the Y direction.

As shown in FIG. 9 and other figures, the push-back member 142 is disposed in a space defined between the side wall portions 141*c* and 141*d* and the side wall portion 141*h*. The push-back member 142 is provided to push back the slider 141 when the electronic device 100 is removed. As shown in FIG. 12, the push-back member 142 includes a rod-shaped portion 142*a* and a flange portion 142*b* protruding from the rod-shaped portion 142*a*.

The slider 141 is provided with a pressed portion 141*g* at the leading end in the installation direction Y1. When the push-back member 142 moves in the removal direction Y2, the flange portion 142*b* presses the pressed portion 141*g* in the removal direction Y2. The slider 141 moves in the removal direction Y2 due to the pressed portion 141*g* being pressed.

The electronic device 100 may include an elastically deformable member such as a spring instead of the push-back member 142. That is, it is sufficient that the electronic device 100 has a mechanism that can move the slider 141 in the removal direction Y2.

The push-back member 142 is also used to secure the electronic device 100 to the rack 200. The rod-shaped portion 142*a* is formed with the male thread at the tip thereof, that is, at the end adjacent to the flange portion 142*b*. The male thread engages with the female thread of the fixing portion 251 provided on the rack back part 250. In other words, the rod-shaped portion 142*a* is screwed to the fixing portion 251 in a state where the case back portion 133 is placed between the flange portion 142*b* and the rack back part 250.

In this way, the push-back member 142 is fixed to the rack back part 250. As the push-back member 142 is fixed to the rack back part 250, the electronic device 100 is fixed to the rack 200. The electronic device 100 is fixed to the rack 200 by the push-back member 142 and the fixing screw 1.

Alternatively, the push-back member 142 may not have a mechanism for fixing the electronic device 100 and the rack 200 to each other.

<Holding Member and Movable Member>

Next, the holding members 260 and the movable members 410 and 420 will be described with reference to FIGS. 3, 13 to 16, and the like. In FIG. 3, the holding members 260 and the movable members 410 and 420 are illustrated in a simplified manner. FIG. 16 shows a state in which the holding member 260 is removed.

The first movable member 410 and the second movable member 420 have many common parts. Therefore, the common parts will be described using the first movable member 410 or the second movable member 420.

Figure 15:
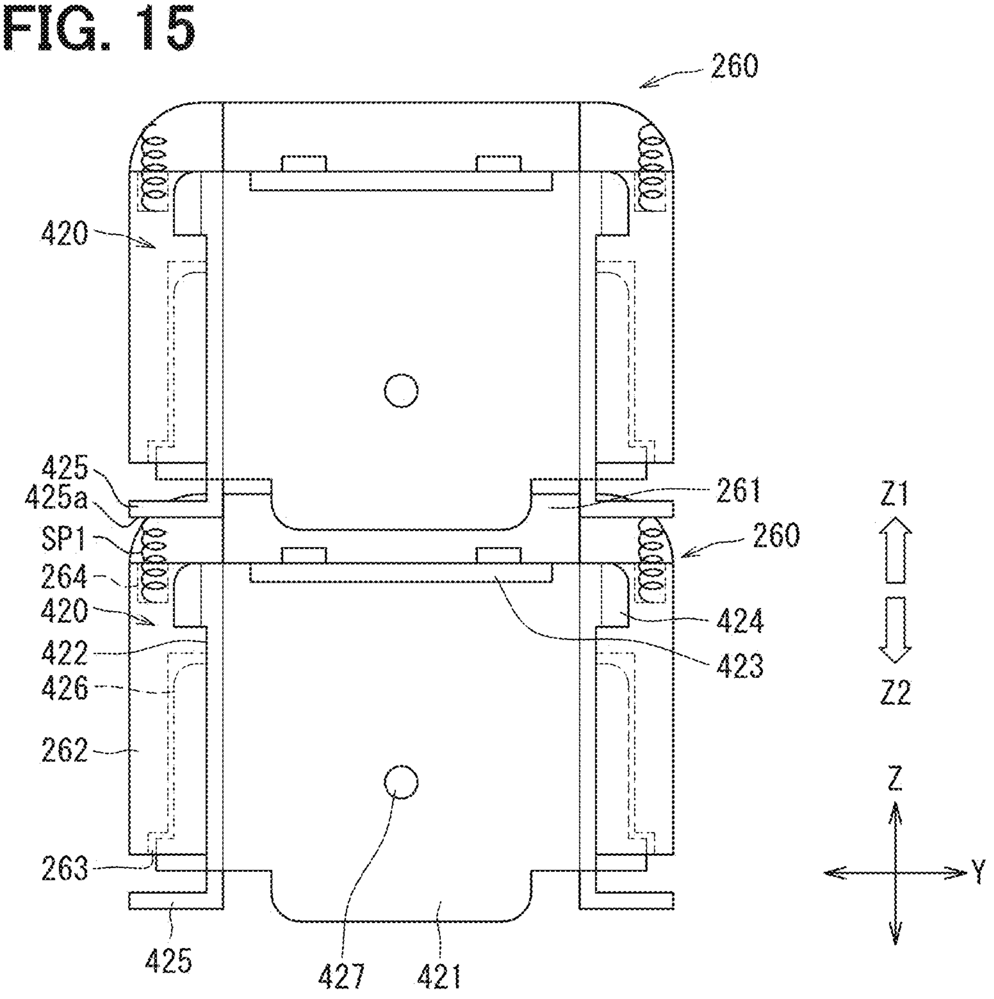
FIG. 15 is a plan view showing a schematic configuration of the holding member and the movable member.
Figure 16:
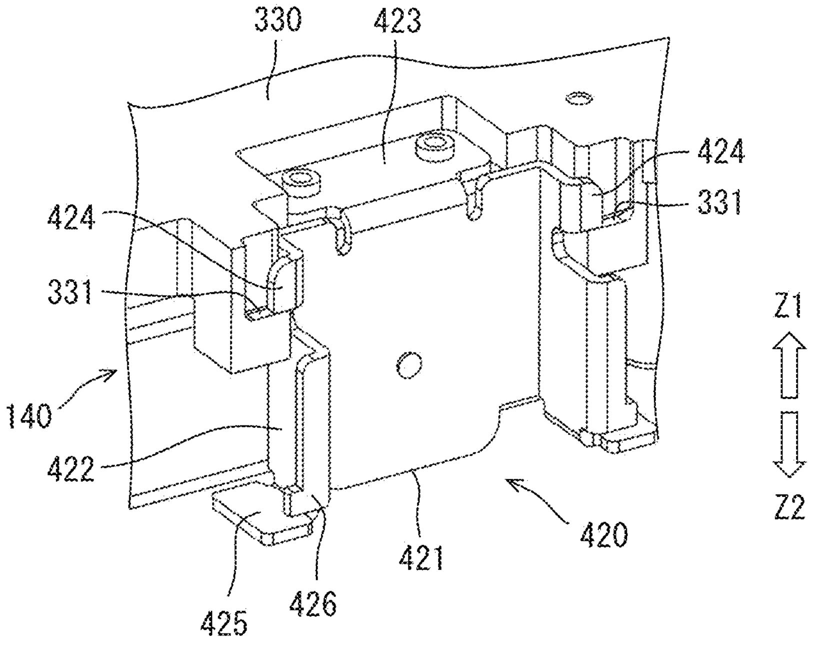
FIG. 16 is a perspective view showing a schematic configuration of the movable member.

In FIG. 15, in order to simplify the illustration, only some of the holding members 260 and the second movable members 420 are shown. The first movable member 410 includes a sliding portion similar to a sliding portion 426. Additionally, the first movable member 410 includes a spring receiving surface similar to a spring receiving surface 425*a*.

Figure 13:
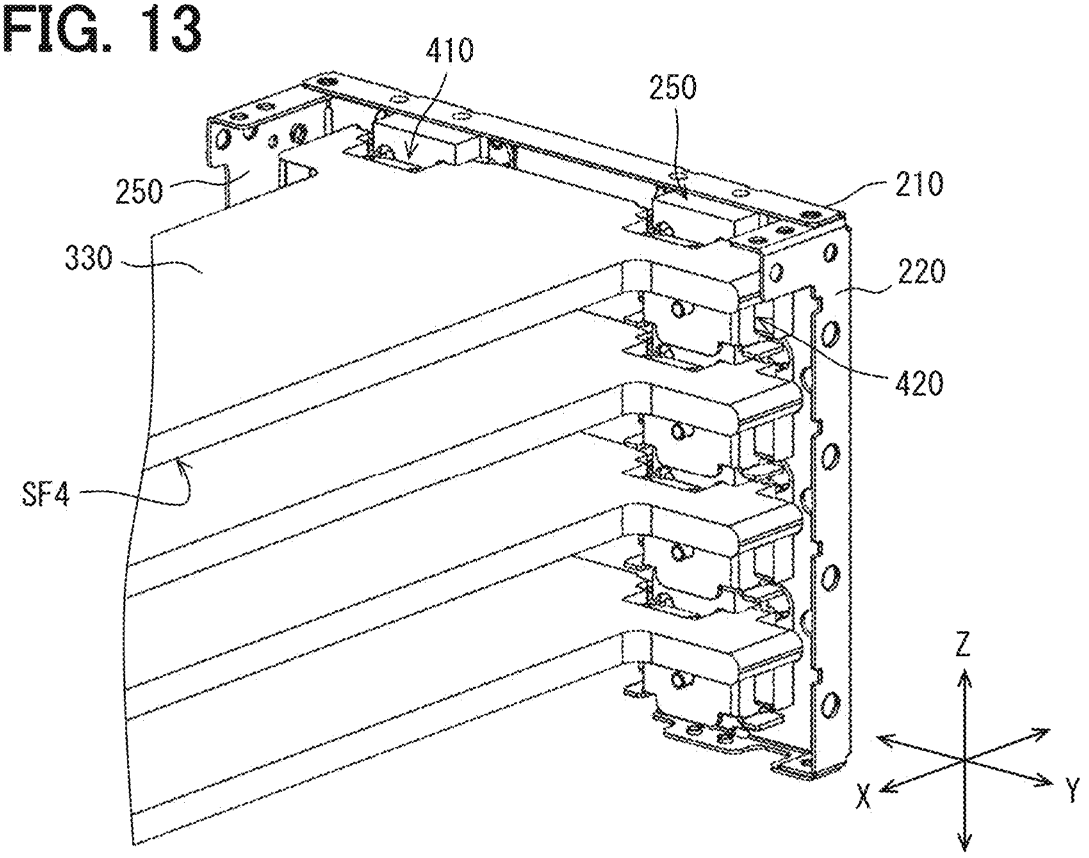
FIG. 13 is a perspective view showing a structure to hold the cooling plate.

First, the holding member 260 will be described. As shown in FIGS. 13 and 16, the holding members 260 are provided at multiple positions on the rack side part 210. The holding member 260 is fixed to the rack side part 210 by means of screws, welding, or the like.

The holding members 260 are provided individually for the movable members 410 and 420. Therefore, the number of the holding members 260 is the same as the number of the movable members 410 and 420. The holding members 260 are provided at four locations on each electronic device 100. That is, as shown in FIG. 3, four holding members 260 are provided for each tier of the rack 200.

Figure 14:
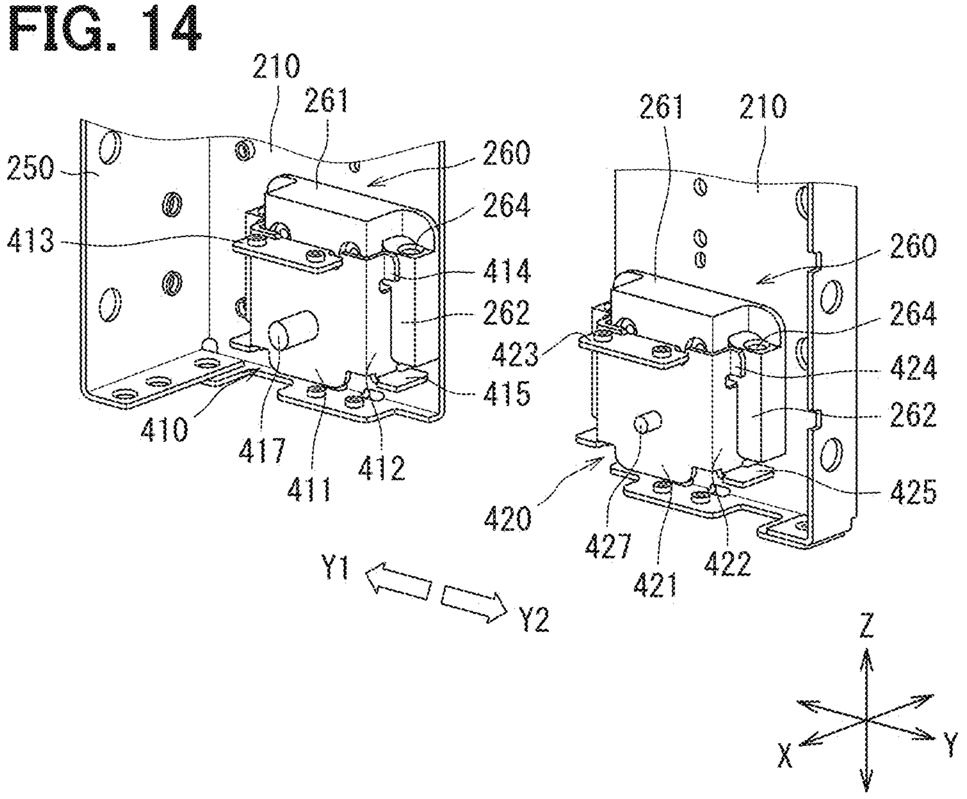
FIG. 14 is a perspective view showing a schematic configuration of a holding member and a movable member.

As shown in FIG. 14, the holding member 260 includes a holding base 261 and holding side portions 262 provided on both ends of the holding base 261. In other words, the holding side portions 262 are provided on opposite sides of the holding base 261 in the Y direction. The holding base 261 and the two holding side portions 262 are provided, for example, as a single body.

As shown in FIG. 15, the holding side portion 262 is formed with a slit 263 for holding the second movable member 420 in a state in which the second movable member 420 can move in the Z direction. The sliding portion 426, which is a part of the second movable member 420, is disposed in the slit 263. The second movable member 420 is movable in the Z direction with the sliding portion 426 disposed in the slit 263. In other words, the sliding portion 426 is capable of sliding in the slit 263 in the Z direction.

As shown in FIGS. 14 and 15, the holding member 260 is formed with a recessed portion 264. The recessed portion 264 forms a hole having a bottomed end. The recessed portion 264 has an opening in the upward direction Z1. A spring member SP1 is disposed in the recessed portion 264. The spring member SP1 is made of a metal as a main component. However, the spring member SP1 is not limited to a member made of the metal as a main component. The spring member SP1 corresponds to an application part or an elastic member. The application part may be made of rubber or the like.

As shown in FIG. 15, the spring member SP1 is placed between the second movable member 420 provided for the upper electronic device 100 and the holding member 260 provided for the lower electronic device 100. It can be said that the holding member 260 provided for the lower electronic device 100 has the recessed portion 264 in which the spring member SP1 is received. The second movable member 420 provided for the upper electronic device 100 has the spring receiving surface 425*a* with which the spring member SP1 is in contact. The spring member SP1 elastically deforms between the holding member 260 and the second movable member 420. The spring member SP1 constantly applies stress to the second movable member 420 in a direction to separate the electronic device 100 and the cooling plate 330. The direction to separate corresponds to the upward direction Z1.

The uppermost holding member 260 in the upward direction Z1 may not be provided with the recessed portion 264. Further, the spring member SP1 may not be disposed in the recessed portion 264 of the uppermost holding member 260.

As shown in FIGS. 14 and 15, the holding member 260 has the recessed portion 264 in each of the holding side portions 262. Therefore, the spring members SP1 are disposed on both sides of the holding base 261 in the Y direction. In addition, it can also be said that the holding member 260 has the recessed portions 254 on both sides of the second protrusion 427 with respect to the installation direction Y1. Therefore, it can be said that the spring members SP1 are provided on both sides of the protrusion 417, 427 in the installation direction Y1.

The spring member SP1 is a member that presses the second movable member 420 in the upward direction Z1. The upward direction Z1 corresponds to the opposite direction to the pressing direction in which the cooling plate 330 presses the thermally conductive member 150. In this case, the pressing direction corresponds to the downward direction Z2.

The spring member SP1 is provided to retain the position of the second movable member 420 in the Z direction in the non-mounting state. In other words, since the electronic control unit 1000 is provided with the spring members SP1, it is easy to hold the second movable member 420 in a predetermined position. This makes it easier to insert the electronic device 100 into the insertion space IN1. In other words, in the electronic control unit 1000, when the electronic device 100 is installed to the rack 200, the guide grooves 141*e* and 141*f* and the protrusions 417 and 427 can be easily aligned in the Z direction. Further, when the electronic device 100 is installed to the rack 200, the protrusions 417 and 427 are easily positioned in the guide grooves 141*e* and 141*f*. Thus, installation of the electronic device 100 to the rack 200 improves.

In the mounting state, the spring member SP1 is pressed in the downward direction Z2 by the spring receiving surface 425*a*. This is because, in the mounting state, the second movable member 420 has been moved in the downward direction Z2. This function will be described in detail later.

Figure 30:
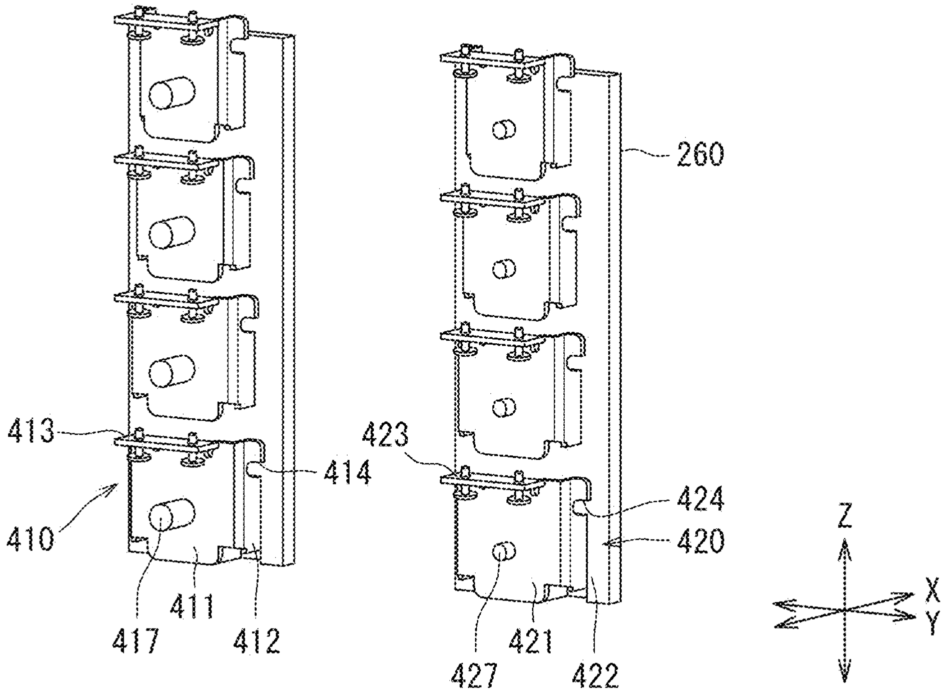
FIG. 30 is a perspective view showing a holding member and a movable member of a modified example.

As shown in FIG. 30, the holding member 260 may be provided in common to multiple movable members 410 and 420. In other words, the holding member 260 is provided in common to the multiple first movable members 410 arranged in the Z direction. Also, the holding member 260 is provided in common to the multiple second movable members 420 arranged in the Z direction.

In this case, the multiple first movable members 410 arranged in the Z direction are attached to the holding member 260 by sliding them in the Z direction, for example. Therefore, it is preferable that the multiple first movable members 410 arranged in the Z direction have different sizes in the Y direction. In FIG. 30, as an example, the size of the multiple first movable members 410 in the Y direction increases in the downward direction Z2. The same applies to the multiple second movable members 420.

Next, the movable members 410 and 420 will be described. FIG. 14 shows the state in which the cooling plate 330 is not mounted.

As shown in FIG. 3, the movable members 410 and 420 are attached to the four corners of the cooling plate 330. Therefore, four movable members 410 and 420 are arranged on each tier of the rack 200. Specifically, two first movable members 410 and two second movable members 420 are attached to the cooling plate 330. As shown in FIG. 14, the first movable member 410 is disposed on the forward side than the second movable member 420 in the installation direction Y1. In other words, the first movable member 410 is disposed adjacent to the rack back part 250, and the second movable member 420 is disposed adjacent to the rack front part 220.

As shown in FIGS. 14, 15 and 16, the first movable member 410 includes a movable base portion 411 and movable side portions 412 provided on both ends of the movable base portion 411. In other words, the movable side portions 412 are provided on opposite sides of the movable base portion 411 in the Y direction. The movable base portion 411 and the two movable side portions 412 are provided, for example, as a single body.

The movable base portion 411 includes a cooling plate fixing portion 413 and a first protrusion 417. The cooling plate fixing portion 413 is a portion that is fixed to the cooling plate 330. The cooling plate fixing portion 413 and the cooling plate 330 are fixed to each other by means of screws, welding, or the like.

The first protrusion 417 is a portion that protrudes in the X direction from the movable base portion 411. The first protrusion 417 of the first movable member 410 disposed on the right side protrudes in the second outward direction X2. The first protrusion 417 of the first movable member 410 disposed on the left side protrudes in the first outward direction X1. The first protrusion 417 has a cylindrical shape.

The first protrusion 417 is provided in correspondence with the first guide groove 141*e*. The number of the protrusions 417 and 427 of the movable members 410 and 420 fixed to one cooling plate 330 is the same as the number of the guide grooves 141*e* and 141*f* provided on one electronic device 100.

The first protrusion 417 is provided as a separate member from the movable base portion 411. The first protrusion 417 is fixed to the movable base portion 411. Alternatively, the first protrusion 417 and the movable base portion 411 may be configured as an integral part, that is, as a single body.

As shown in FIGS. 14 and 16, the movable side portion 412 includes a cooling plate pressing portion 414 and the spring receiving portion 415. The cooling plate pressing portion 414 is provided at an upper end of the movable side portion 412 in the upward direction Z1. The cooling plate pressing portion 414 is in contact with a pressing auxiliary portion 331 of the cooling plate 330. As described above, the first movable member 410 is fixed to the cooling plate 330 and moves the cooling plate 330 in the downward direction Z2 in the state of being fixed to the cooling plate 330. In other words, the first movable member 410 presses down the cooling plate 330 in the downward direction Z2. The cooling plate pressing portion 414 is a portion that assists pressing down operation of the cooling plate 330. The first movable member 410 is provided with the cooling plate pressing portion 414, so that the pressing force for forcing the cooling plate 330 in the downward direction Z2 can be increased. Alternatively, the first movable member 410 may not include the cooling plate pressing portion 414.

The second movable member 420 includes a movable base portion 421 and movable side portions 422 provided on both ends of the movable base portion 421. The movable base portion 421 includes a cooling plate fixing portion 423 and a second protrusion 427. The second protrusion 427 is provided in correspondence with the second guide groove 141*f*.

The movable side portion 422 includes a cooling plate pressing portion 424, a spring receiving portion 425, and a sliding portion 426. As described above, the spring receiving portion 425 has the spring receiving surface 425*a*. The sliding portion 426 is a portion that is disposed in the slit 263 as described above. The sliding portion 426 is a portion that slides in the Z direction within the slit 263. The sliding portion 426 is disposed within the slit 263 and thus can also be considered as a flat plate portion that is movable within the slit 263.

As shown in FIG. 14, the first protrusion 417 is longer than the second protrusion 427. In other words, the second protrusion 427 arranged on the front side, that is, on the trailing side in the installation direction Y1 is shorter than the first protrusion 417 arranged on the back side, that is, on the leading side in the installation direction Y1. The electronic control unit 1000 makes it possible to insert the electronic device 100 while restricting the slide member 140 and other components from coming into contact with the second protrusion 427. In other words, the electronic control unit 1000 can improve the guiding performance when inserting the electronic device 100 into the insertion space IN1. The guiding performance can also be referred to as insertion performance or installation performance.

Incidentally, forces are applied to the first protrusion 417 and the second protrusion 427 from the slider 141 when the cooling plate 330 is pressed down in the downward direction Z2. Th forces are also applied to a boundary portion between the first protrusion 417 and the movable base portion 411 and a boundary portion between the second protrusion 427 and the movable base portion 421. As described above, the first protrusion 417 is longer than the second protrusion 427. Therefore, the force applied to the boundary portion between the first protrusion 417 and the movable base portion 411 is larger than the force applied to the boundary potion between the second protrusion 427 and the movable base portion 421.

Therefore, as shown in FIG. 14, the first protrusion 417 has a larger diameter than the second protrusion 427. This can improve the strength of the boundary portion between the first protrusion 417 and the movable base portion 411. However, the first protrusion 417 may have a diameter similar to that of the second protrusion 427 as long as the first protrusion 417 can ensure the strength.

<Positioning Member and Base Substrate>

Figure 23:
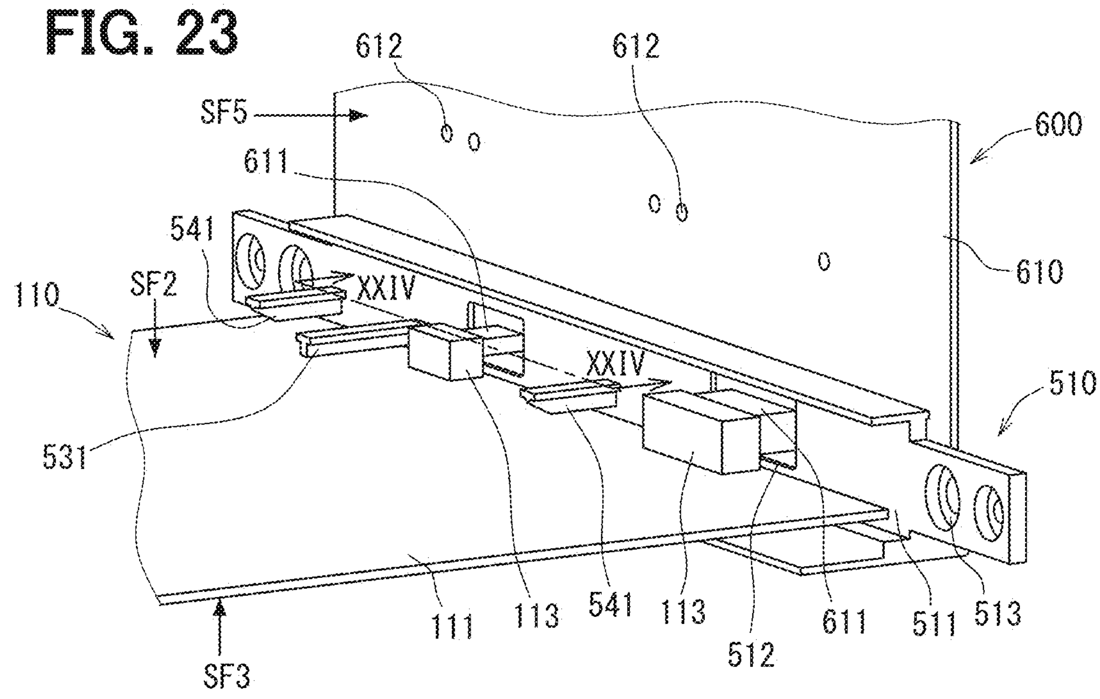
FIG. 23 is a perspective view showing a schematic configuration of the positioning member, the base substrate, and a wiring board.
Figure 25:
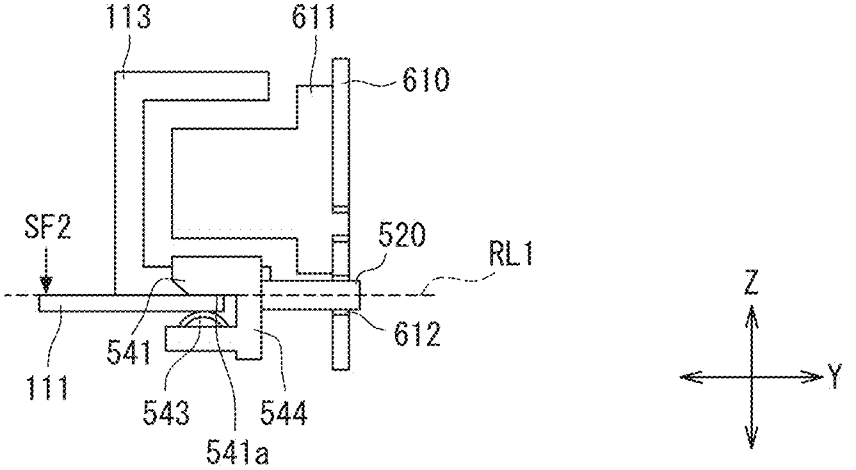
FIG. 25 is an image diagram showing positioning by a second positioning part.
Figure 26:
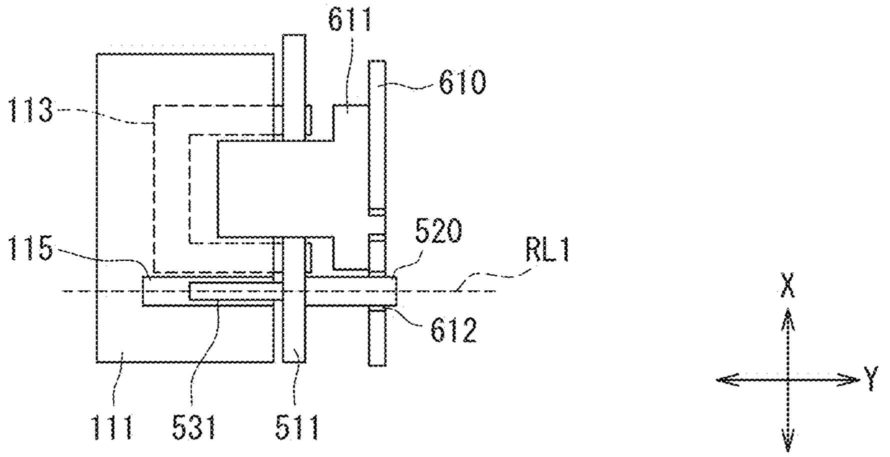
FIG. 26 is an image diagram showing positioning by a first positioning part.

The positioning member 510 and the base substrate 600 will be described with reference to FIGS. 17 to 26. In FIG. 23, in order to make the relationship between the positioning members 510 and the wiring boards 111 easier to understand, only one positioning member 510 and only one wiring board 111 are shown. For the same reason, the case of the electronic device 100 is not illustrated. In FIGS. 25 and 26, the inter-board connectors 113 and 611 are illustrated in a simplified manner.

Figure 17:
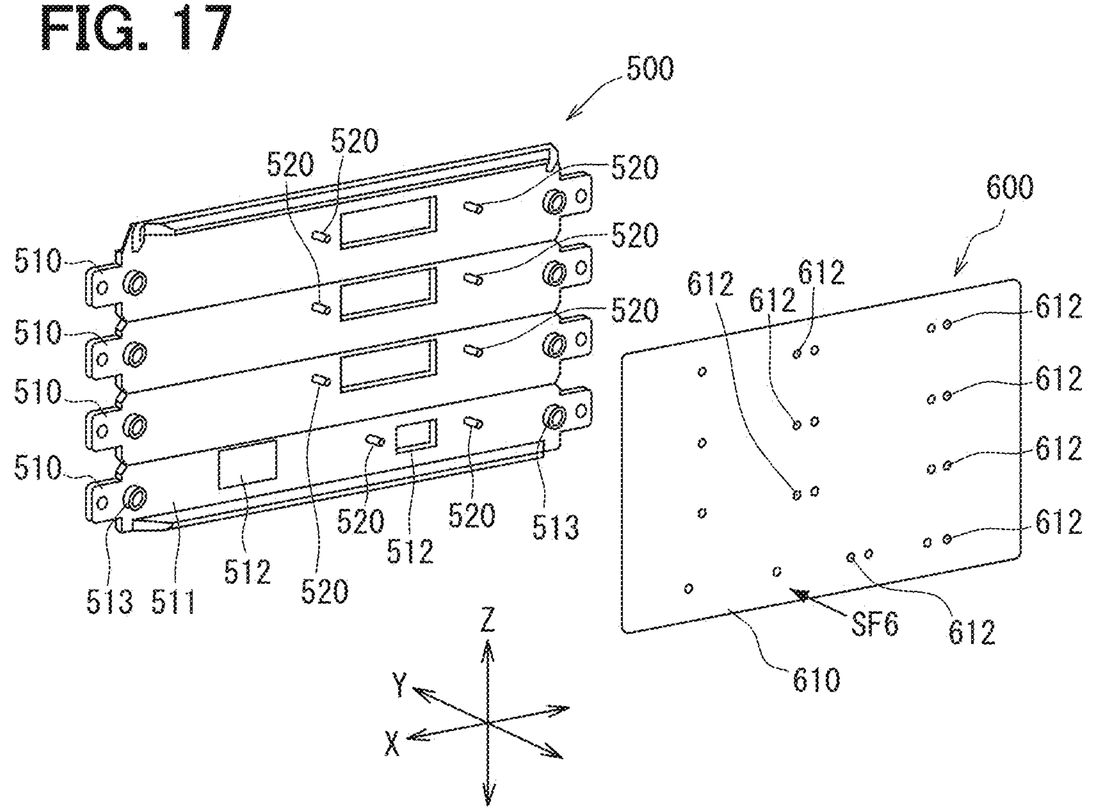
FIG. 17 is a perspective view showing a schematic configuration of a positioning member and a base substrate.

First, the base substrate 600 will be described with reference to FIGS. 17, 21, 23 and the like. The base substrate 600 includes a wiring board 610, the inter-board connector 611, and the like. The wiring board 610 has a base made of an electrically insulating material, such as a resin, and conductive wirings provided on the base. The wiring board 610 is a so-called printed circuit board. The wiring board 610 is disposed along the XZ plane in a state in which the wiring board 610 and the electronic device 100 are electrically connected. The XZ plane is a plane defined by the X-axis and the Z-axis. The state in which the wiring board 610 and the electronic device 100 are electrically connected is referred to as a board-to-board connection state. In the insertion state, for example, the wiring board 610 and the electronic device 100 are in the board-to-board connection state.

The wiring board 610 has a mounting surface SF5 on which the inter-board connector 611 is mounted, and an opposite surface SF6 opposite to the mounting surface SF5. The inter-board connector 611 is electrically connected to the wirings of the wiring board 610. As shown in FIG. 23, the inter-board connector 113 is electrically connected to the inter-board connector 611. That is, the electronic device 100 is mounted on the mounting surface SF5. Note that the wiring board 610 may have circuit elements, such as semiconductor switching elements, resistor elements, and capacitor elements, mounted thereon.

The number of the electronic devices 100 that can be mounted on the base substrate 600 is preset. In the present embodiment, as an example, the base substrate 600 on which four electronic devices 100 can be mounted is adopted. Therefore, the base substrate 600 is provided with the same number of the inter-board connectors 611 as the number of the electronic devices 100 mounted thereon.

The wiring board 610 is formed with positioning holes 612. In the board-to-board connection state, a first protrusion 520 of the positioning member 510 is placed in the positioning hole 612. The positioning hole 612 corresponds to a first positioning hole.

The positioning hole 612 is individually provided for each electronic device 100 mounted on the base substrate 600. Further, in the present embodiment, the positioning member 510 is provided for each electronic device 100. Therefore, the positioning holes 612 are provided individually, correspondingly to the positioning members 510.

Two positioning holes 612 are provided for one positioning member 510. One of the two positioning holes 612 is provided for positioning the inter-board connectors 113 and 611 in the X and Z directions. The other of the two positioning holes 612 is provided for suppressing rotational deviation. The rotational deviation means rotation of the base substrate 600 and the positioning member 510 about the Y axis.

The positioning hole 612 is a hole that penetrates the wiring board 610 in its plate thickness direction (Y direction). The positioning hole 612 is a through hole provided along the Y direction. The plate thickness direction of the wiring board 610 corresponds to the Y direction, and the thickness of the wiring board 610 corresponds to the distance between the mounting surface SF5 and the opposite surface SF6. The plate thickness direction of the wiring board 610 can also be regarded as the thickness direction of the base substrate 600. The positioning hole 612 may be a bottomed hole that opens on the mounting surface SF5. That is, the positioning hole 612 may be a recessed portion.

The two positioning holes 612 corresponding to one positioning member 510 are provided at positions shifted from each other in the X direction. For example, two positioning holes 612 are provided on both sides of the inter-board connector 611 in the X direction. Moreover, the positions of the two positioning holes 612 are the same in the Z direction.

Next, the positioning member 510 will be described with reference to FIGS. 17 to 26. The positioning members 510 are provided individually, correspondingly for the electronic devices 100 mounted on the base substrate 600. As shown in FIG. 17, the multiple positioning members 510 stacked in the Z direction form the positioning structure 500. The positioning members 510 are provided as separate members.

Figure 21:
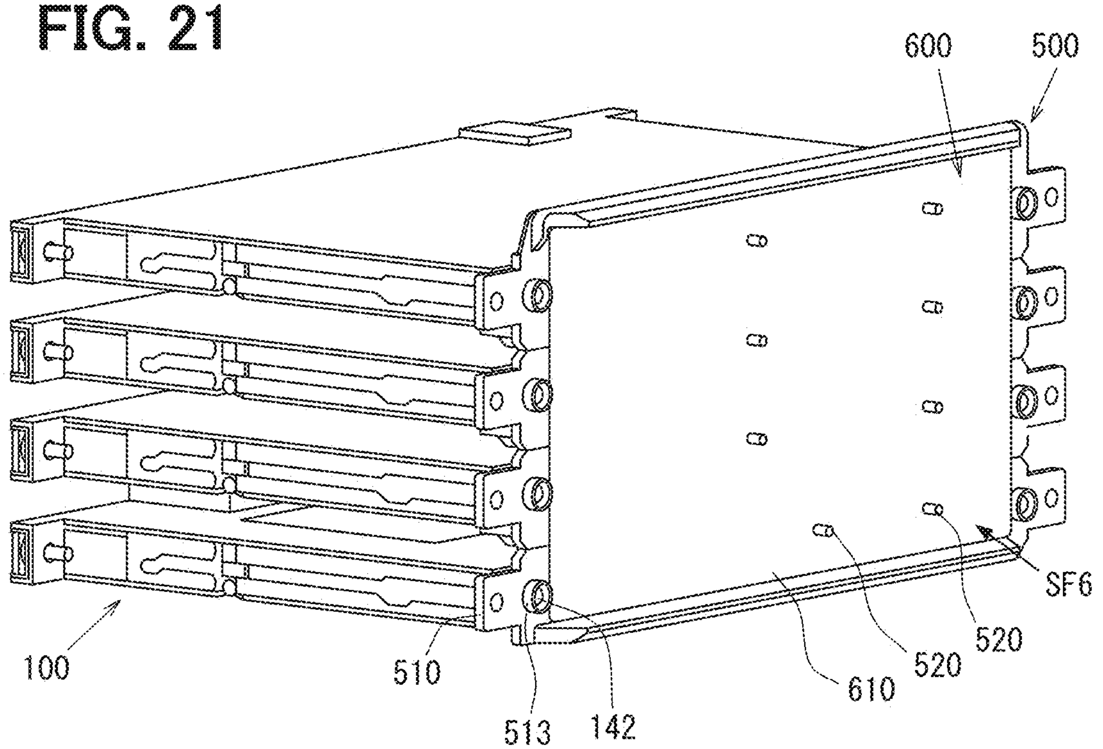
FIG. 21 is a perspective view showing a schematic configuration of the positioning member, the base substrate, and the electronic device.
Figure 22:
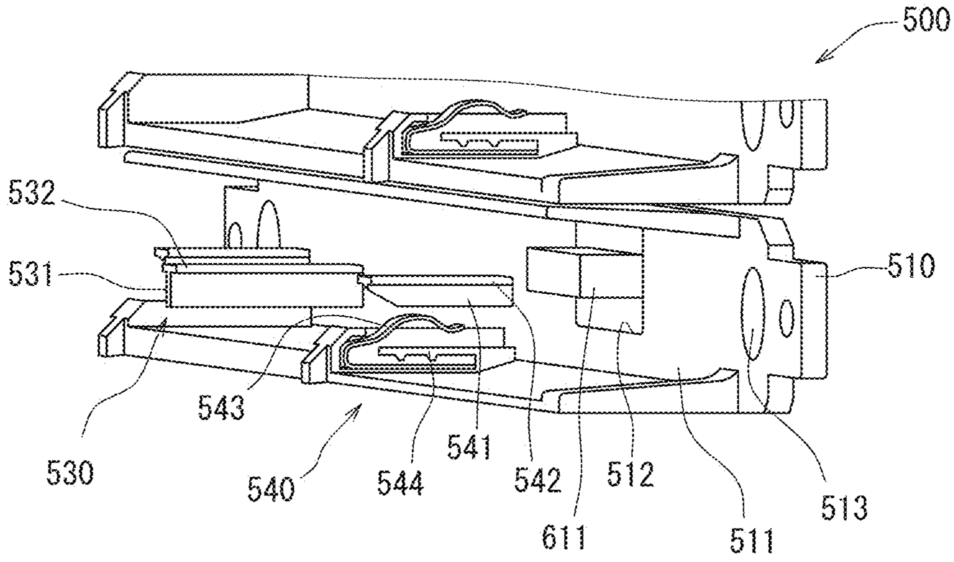
FIG. 22 is an enlarged perspective view showing a schematic configuration of the positioning member.

As shown in FIG. 21, the multiple positioning members 510 are placed between the base substrate 600 and the multiple electronic devices 100. The positioning member 510 is a member for positioning the inter-board connector 611 of the base substrate 600 and the inter-board connector 113 of the electronic device 100. The multiple positioning members 510 have the same configuration. In the following, a description will be given using one positioning member 510 as a representative example.

As shown in FIGS. 17, 18, 21, and 22, the positioning member 510 includes a positioning base 511 formed with a connector opening 512 and a member arrangement hole 513. The connector opening 512 is a through hole in which the inter-board connector 611 is placed. The member arrangement hole 513 is a through hole in which the push-back member 142 is placed.

The positioning base 511 has a first protrusion 520 on a surface facing the base substrate 600. The first protrusion

520 protrudes in the installation direction Y1 from the periphery. The first protrusion 520 is a protrusion for positioning the positioning base 511 with respect to the base substrate 600. The first protrusion 520 is inserted into the positioning hole 612.

Figure 18:
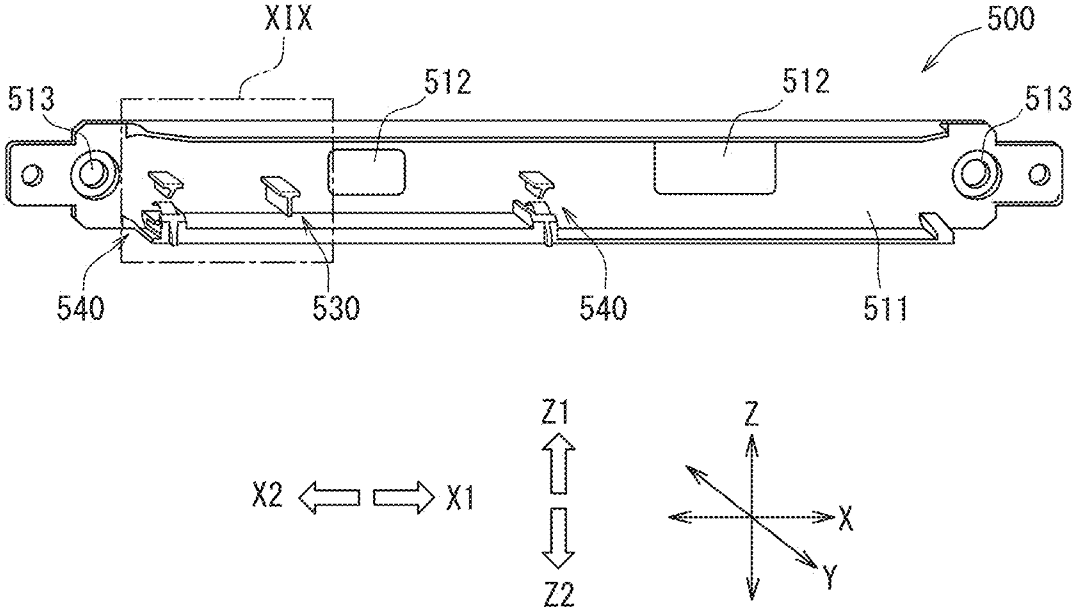
FIG. 18 is a perspective view showing a schematic configuration of the positioning member.

As shown in FIGS. 18, 23 and the like, the positioning member 510 has a first positioning part 530 and a second positioning part 540 on the surface facing the electronic device 100. The second positioning part 540 corresponds to a clamping part.

The first positioning part 530 has a second protrusion 531 and a reinforcing portion 532 that protrudes in a direction intersecting with the second protrusion 531. The second protrusion 531 is a protrusion for positioning the positioning member 510 and the wiring board 111. The second protrusion 531 is a portion that protrudes in the removal direction Y2 from the periphery. The second protrusion 531 can also be regarded as a protrusion for positioning the inter-board connector 611 and the inter-board connector 113 relative to each other in the X direction.

Figure 24:
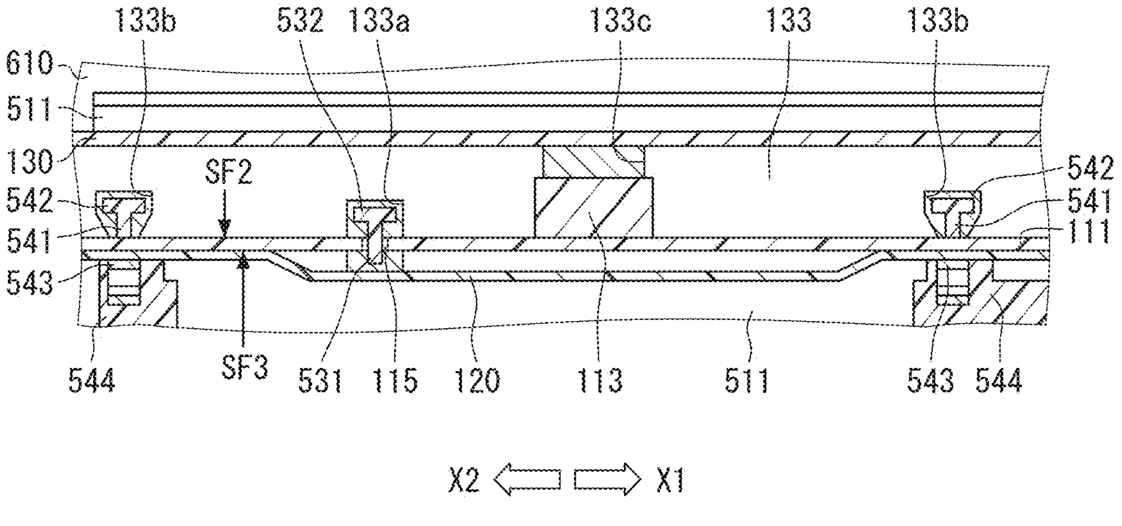
FIG. 24 is a cross-sectional view taken along a line XXIV-XXIV in FIG. 23.

As shown in FIG. 24, the case (case back portion 133) of the electronic device 100 is placed between the positioning member 510 and the wiring board 111. A portion of the second protrusion 531 is inserted into the first opening 133*a* and is placed on the wiring board 111 side. Further, the second protrusion 531 is inserted into the positioning slit 115. The second protrusion 531 has, for example, a flat plate shape extending from the positioning base 511 in the Y direction. However, the second protrusion 531 may have any shape as long as it can be inserted into the positioning slit 115.

As shown in FIG. 26, the second protrusion 531 is provided coaxially with a center axis RL1 of the first protrusion 520. In other words, the center line of the second protrusion 531 and the center line of the first protrusion 520 are aligned on the same straight line. The center line of the second protrusion 531 is an imaginary straight line that passes through the center of the second protrusion 531 in the X and Z directions and extends in the Y direction. The center line of the first protrusion 520 is an imaginary straight line that passes through the center of the first protrusion 520 in the X and Z directions and extends in the Y direction. Therefore, the imaginary line coincides with the center axis RL1.

The second protrusion 531 is inserted into the positioning slit 115 of the wiring board 111. Therefore, it can be considered that the center line of the second protrusion 531 coincides with the center line of the positioning slit 115. The center line of the positioning slit 115 is an imaginary straight line that passes through the center of the positioning slit 115 in the X and Z directions and extends in the Y direction.

In addition, it can also be said that the axis extending in the Y direction of the first protrusion 520 is coaxial with the center line of the second protrusion 531 in the X and Z directions. Furthermore, it can be said that the center line of the second protrusion 531 and the center line of the first protrusion 520 are aligned in the X and Z directions.

In this manner, the positioning slit 115 serves as a positional reference on the wiring board 111 in the X direction. On the other hand, the second protrusion 531 of the positioning member 510 serves as a positional reference for the wiring board 111. The first protrusion 520 of the positioning member 510 serves as a positional reference for the base substrate 600. Further, the positional reference for the wiring substrate 111 and the positional reference for the base substrate 600 are common. Therefore, the positional reference for the wiring board 111 can be regarded as the center line of the positioning slit 115. The positional reference of the positioning member 510 can be regarded as the center axis RL1.

As shown in FIG. 24 and the like, the positioning member 510 has only one second protrusion 531. The positioning member 510 has the second protrusion 531 provided at only one location, which is inserted into one positioning slit 115 formed in the wiring board 111. Only one second protrusion 531 serves as a member for positioning the inter-board connector 113 and the inter-board connector 611 in the X direction.

The reinforcing portion 532 is provided to reinforce the second protrusion 531. The reinforcing portion 532 is configured as one piece with the second protrusion 531. The reinforcing portion 532 is provided, for example, at the end of the second protrusion 531. In this case, the first positioning part 530 has a T-shape in cross section defined along the XZ plane. However, the configuration of the reinforcing portion 532 is not limited to this example. The first positioning part 530 may not have the reinforcing portion 532.

The second positioning part 540 is a portion that holds the electronic device 100 in the Z direction. The second positioning part 540 is a portion for positioning the positioning member 510 and the wiring board 111 relative to each other. The second positioning part 540 can also be regarded as a portion for positioning the inter-board connector 611 and the inter-board connector 113 in the Z direction. The positioning member 510 has multiple second positioning parts 540 for one electronic device 100.

The second positioning part 540 has a contact portion 541 and a reinforcing portion 542 that protrudes in a direction intersecting with the contact portion 541. As shown in FIGS. 23 and 24, the contact portion 541 is a portion that protrudes in the removal direction Y2 from the periphery. The reinforcing portion 542 has a similar structure to the reinforcing portion 532. Alternatively, the second positioning part 540 may not have the reinforcing portion 542.

The contact portion 541 is a portion that comes into contact with the wiring board 111. More specifically, the contact portion 541 has a contact surface 541*a* that comes into contact with the wiring board 111 (SF2). The contact portion 541 has, for example, a flat plate shape extending in the Y direction from the positioning base 511. However, the contact portion 541 may have any shape as long as it can come into contact with the surface SF2 of the wiring board 111.

Figure 19:
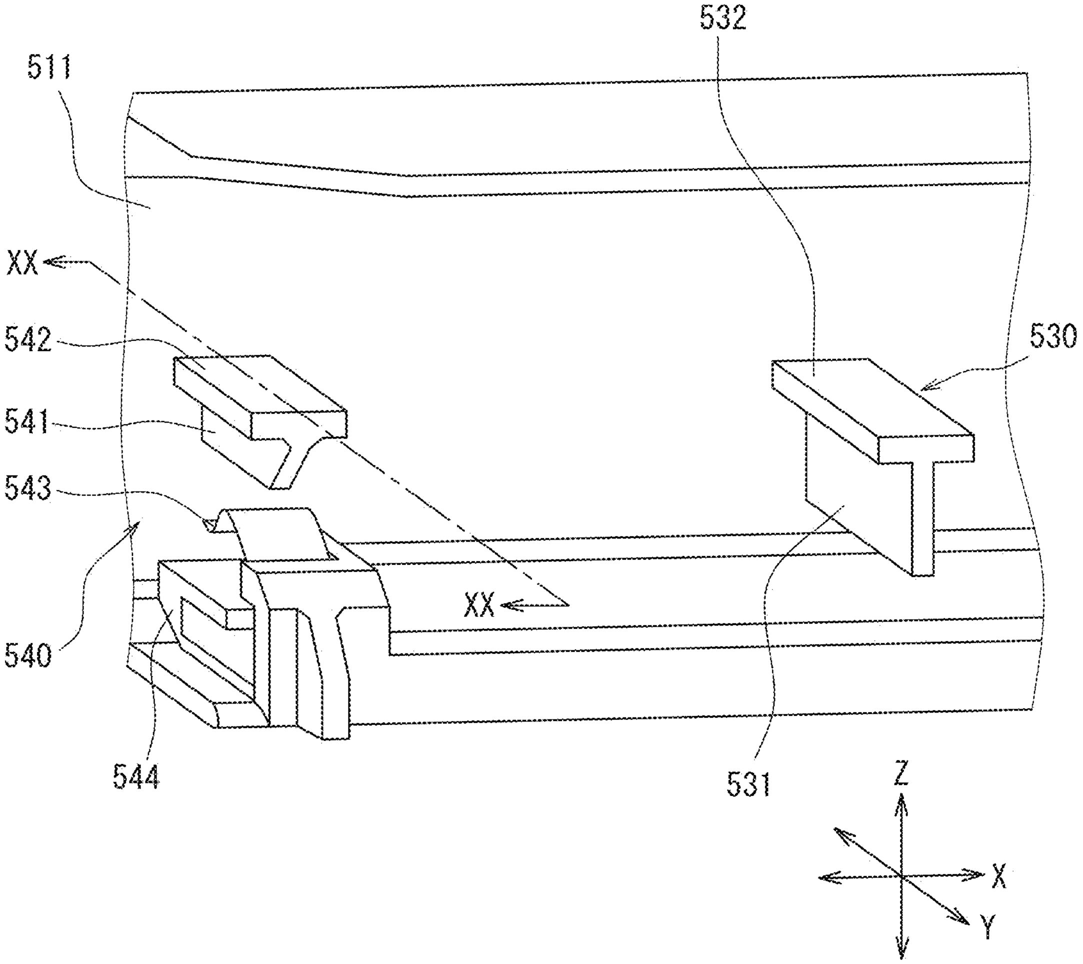
FIG. 19 is an enlarged view of a region XIX in FIG. 18.
Figure 20:
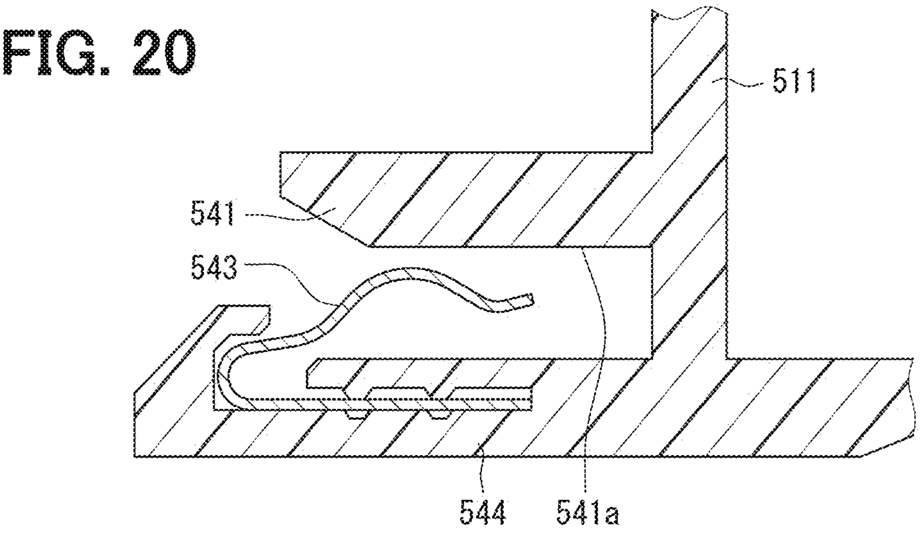
FIG. 20 is a cross-sectional view taken along a line XX-XX in FIG. 19.

As shown in FIGS. 18, 19, and 20, the second positioning part 540 includes a pressing member 543 provided at a position facing the contact portion 541. The pressing member 543 presses the electronic device 100 (wiring board 111) against the contact portion 541. The pressing member 543 is a cantilever leaf spring. The second positioning part 540 includes a fixing portion 544 to which a pressing member 543 is fixed. The fixing portion 544 is provided, for example, as an integral part with the positioning base 511. Alternatively, the pressing member 543 may be a double-supported leaf spring.

As shown in FIG. 24, a portion of the contact portion 541 is inserted into the second opening 133*b* and placed on the wiring board 111 side. The contact surface 541*a* contacts the surface SF2 of the wiring board 111. On the other hand, the pressing member 543 is placed outside the case. The pressing member 543 comes into contact with the base 120 and presses the base 120. The wiring board 111 is fixed to the base 120. Therefore, the pressing member 543 presses the wiring board 111 through the base 120. Moreover, the pressing member 543 presses the wiring board 111 against the contact surface 541*a*.

In this manner, the second positioning part 540 holds the wiring board 111 in the Z direction. The pressing member 543 may be inserted into the case and directly pressed against the opposite surface SF3 of the wiring board 111.

As shown in FIG. 25, the contact surface 541*a* is provided along the center axis RL1 of the first protrusion 520. The contact surface 541*a* coincides with the center axis RL1 in the Z direction. That is, the first surface SF2 serves as the positional reference (reference surface) in the Z direction. The positional reference of the positioning member 510 is the center axis RL1 of first protrusion 520, similarly to the positioning in the X direction. Further, the pressing member 543 presses the wiring board 111 so that the first surface SF2 and the center axis RL1 coincide with each other.

The pressing member 543 may be provided as a separate member from the second positioning part 540. It is sufficient that the pressing member 543 can press the wiring board 111 so that the first surface SF2 and the center axis RL1 coincide with each other.

<Installation and Removal>

Figure 27:
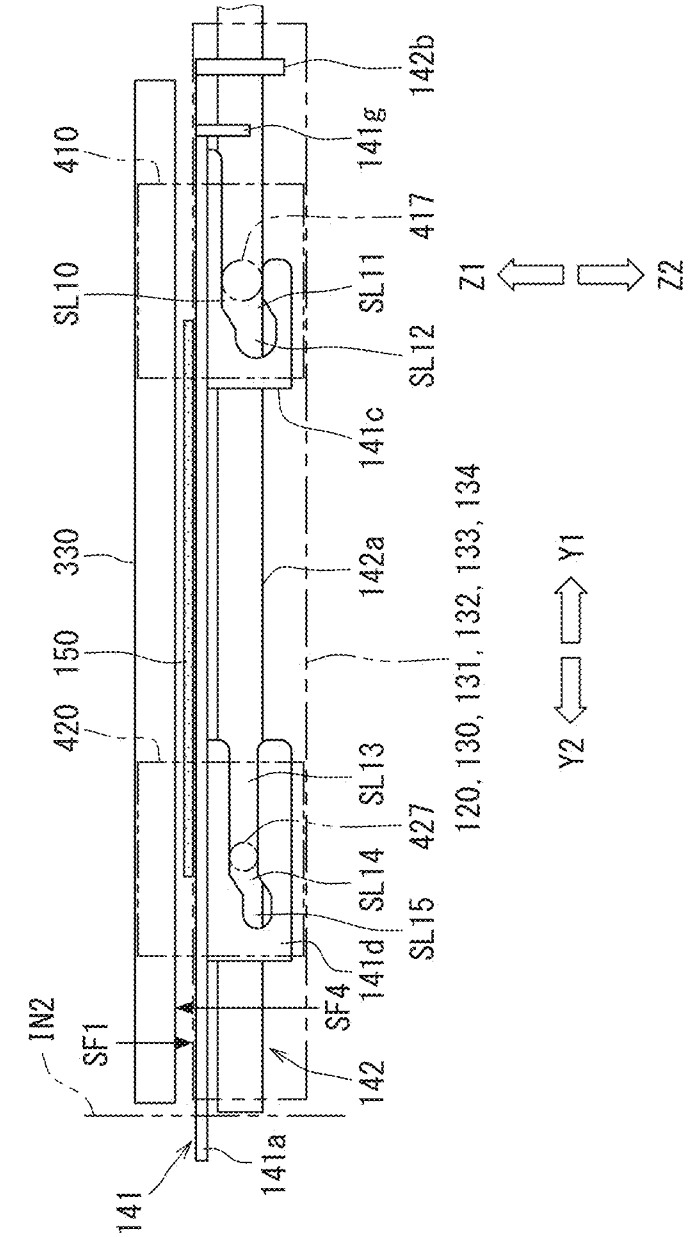
FIG. 27 is an image diagram showing installation of the electronic device.

Next, the installation and removal of the electronic device 100 will be described with reference to FIGS. 27 to 29. Here, the positional relationship between the slider 141 and the protrusions 417, 427 in each state, and the positions of the movable members 410, 420, and the like will also be described. The electronic device 100 can be installed and removed by an operator such as a dealer or a worker at a factory.

First, the installation of the electronic device 100 to the rack 200 will be described with reference to FIGS. 27 and 28. As shown in FIG. 27, when being installed into the rack 200, the electronic device 100 is inserted into the insertion space IN1 through the insertion opening IN2. The electronic device 100 is inserted with the thermally conductive member 150 provided on the facing surface SF1. The thermally conductive member 150 may be provided on the facing surface SF4 of the cooling plate 330. FIG. 27 shows the insertion state.

The electronic device 100 moves in the installation direction Y1 in a state where the first protrusion 417 is received in the flat portion SL10 and the second protrusion 427 is received in the flat portion SL13. Then, the electronic device 100 is inserted to the back end of the insertion space IN1. That is, the electronic device 100 is moved to a placement position at which the electronic device 100 faces the cooling plate 330, in a state where the thermally conductive member 150 is in contact with only one of the electronic device 100 or the cooling plate 330.

In this state, the male screw provided at the tip of the push-back member 142 is screwed into the fixing portion 251 provided on the rack back part 250. Moreover, the electronic device 100 is fixed to the rack 200 by the fixing screw 1. In this way, the electronic device 100 is secured to the rack 200.

In the insertion state, a part of the slider 141 is located outside the insertion opening IN2. Further, the first protrusion 417 is located in the flat portion SL10, and the second protrusion 427 is located in the flat portion SL13. Therefore, the movable members 410 and 420 have not been moved in the downward direction Z2. As such, the thermally conductive member 150 is not in contact with the cooling plate 330 (opposing surface SF4). In other words, a clearance remains between the thermally conductive member 150 and the cooling plate 330 in the Z direction. The thermally conductive member 150 is in an uncompressed state.

Figure 28:
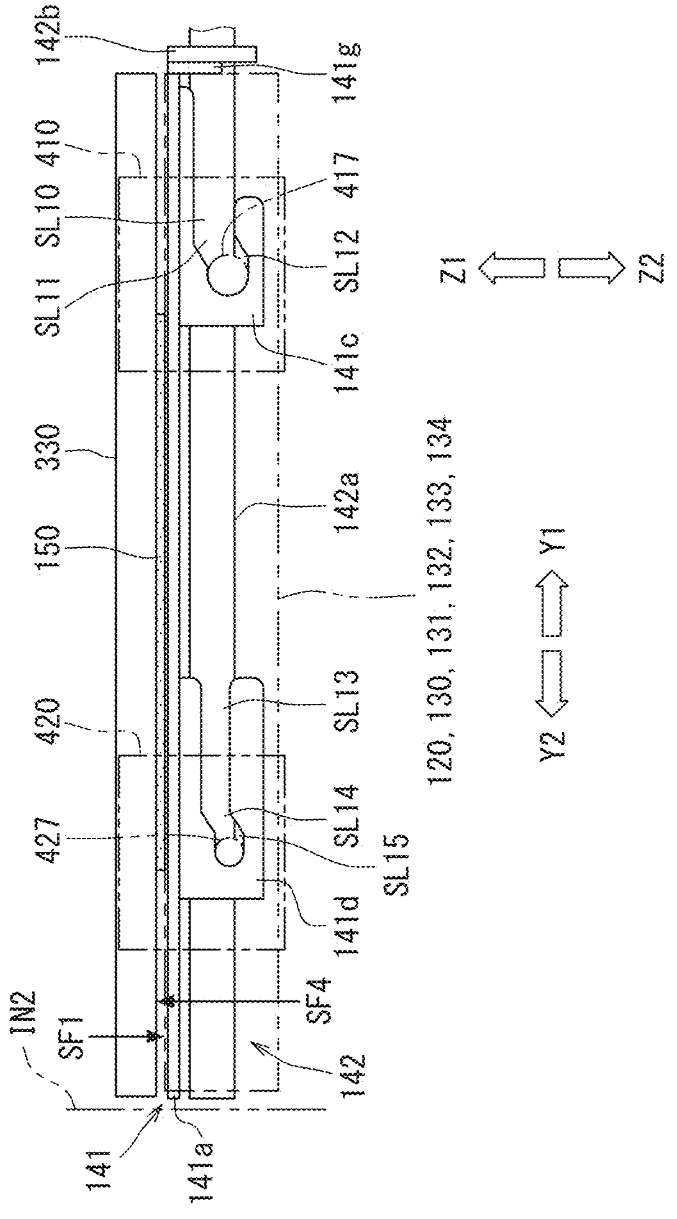
FIG. 28 is an image diagram showing installation of the electronic device.
Figure 29:
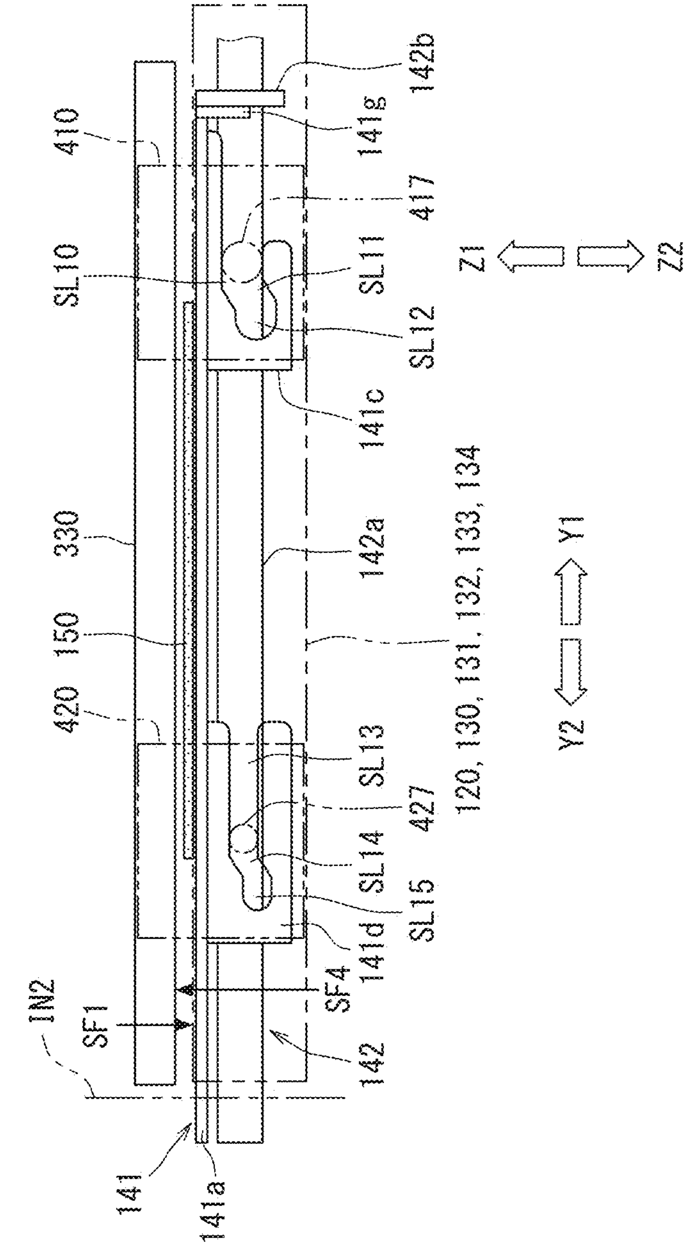
FIG. 29 is an image diagram showing removal of the electronic device.

Next, as shown in FIG. 28, the cooling plate 330 is moved in the downward direction Z2. After the electronic device 100 has moved to the placement position, the positions of the protrusions 417 and 427 are shifted from the inclined portions SL11 and SL14 to the holding portions SL12 and SL15, respectively, so as to move and attract the movable members 410 and 420. FIG. 28 shows the mounting state.

More specifically, in the state where the electronic device 100 has been moved to the placement position, the slider 141 is pushed in the installation direction Y1. That is, after the electronic device 100 has moved to the placement position, the slider 141 is moved in the installation direction Y1, so that the position of the first protrusion 417 is shifted from the inclined portion SL11 to the holding portion SL12. Similarly, the position of the second protrusion 427 is shifted from the inclined portion SL14 to the holding portion SL15. The slider 141 can be moved by an operator.

In this manner, the positions of the protrusions 417 and 427 are changed from the inclined portions SL11 and SL14 to the holding portions SL12 and SL15, respectively. As a result, the movable members 410 and 420 are pulled down in the downward direction Z2 by the slider 141. Therefore, the movable members 410 and 420 are moved in the downward direction Z2.

The movable members 410 and 420 are fixed to the cooling plate 330. Therefore, the cooling plate 330 is moved in the downward direction Z2 in accordance with the movement of the movable members 410 and 420. The cooling plate 330 is moved in the downward direction Z2 and brought into contact with the thermally conductive member 150. Further, the cooling plate 330 compresses the thermally conductive member 150 together with the electronic device 100.

Therefore, the thermally conductive member 150 is in the state of being in contact with the cooling plate 330 (facing surface SF4). Moreover, the thermally conductive member 150 is pressed (compressed) in the Z direction by the electronic device 100 and the cooling plate 330. In this manner, the electronic device 100 is mounted to the rack 200 so that the thermally conductive member 150 is in contact with both the electronic device 100 and the cooling plate 330.

As described above, in the mounting state, the first protrusion 417 is located in the holding portion SL12, and the second protrusion 427 is located in the holding portion SL15. The protrusions 417 and 427 are engaged with the holding portions SL12 and SL15, respectively. The movement of the slider 141 in the installation direction Y1 is restricted due to the protrusions 417 and 427 being received by the holding portions SL12 and SL15.

The amount of movement of the first protrusion 417 in the Z direction described above corresponds to an orthogonal distance between the flat portion SL10 and the holding portion SL12. Similarly, the amount of movement of the second protrusion 427 in the Z direction corresponds to the orthogonal distance between the flat portion SL13 and the holding portion SL15. The amount of movement, that is, the travel distance is the same between the first protrusion 417 and the second protrusion 427. The orthogonal distance can be regarded as the distance between the flat portion SL10 and the holding portion SL12 in the Z direction.

As the slider 141 moves in the installation direction Y1, the cooling plate 330 moves by the orthogonal distance. The orthogonal distance is set according to the amount by which the thermally conductive member 150 is desired to be compressed (amount of compression, compressive force). The orthogonal distance for obtaining the optimum compressive force can be set by experiment, simulation, or the like.

The orthogonal distance can also be set taking into consideration the clearance that is desired to be secured when the electronic device 100 is mounted on the rack 200. The inclination angles of the inclined portions SL11 and SL14 are set to angles that do not impede the movement of the slider 141.

Next, the removal of the electronic device 100 from the rack 200 will be described with reference to FIG. 29. First, the push-back member 142 is separated from the fixing portion 251. Further, the push-back member 142 is moved in the removal direction Y2. At this time, the push-back member 142 is moved in the removal direction Y2 in a state in which the flange portion 142*b* is in contact with the pressed portion 141*g*. As a result, the slider 141 is moved in the removal direction Y2. That is, the slider 141 is pushed back in the removal direction Y2.

As the slider 141 is moved in the removal direction Y2, the position of the first protrusion 417 is displaced from the holding portion SL12 to the inclined portion SL11 and to the flat portion SL10. Similarly, the position of the second protrusion 427 is displaced from the holding portion SL15 to the inclined portion SL14 and to the flat portion SL13.

In this manner, the positions of the protrusions 417 and 427 are displaced from the holding portions SL12 and SL15 to the flat portions SL10 and SL13, respectively. Therefore, the movable members 410 and 420 are pushed up from the slider 141 in the upward direction Z1. Also, the cooling plate 330 is moved in the upward direction Z1 together with the movement of the movable members 410 and 420.

At this time, the first protrusion 417 is located in the flat portion SL10, and the second protrusion 427 is located in the flat portion SL13. The movable members 410 and 420 have been moved in the upward direction Z1. Therefore, the thermally conductive member 150 is spaced apart from the cooling plate 330. In this state, the electronic device 100 is moved in the removal direction Y2, and thus is removed from the rack 200.

ADVANTAGEOUS EFFECTS

As described above, the electronic control unit 1000 is configured so that the electronic device 100 is installable or removable to the rack 200. When the electronic device 100 is installed to the rack 200, the electronic device 100 is placed at the placement position in which the electronic device 100 faces the cooling plate 330 with the thermally conductive member 150 in contact with the electronic device 100. After the electronic device 100 is placed in the placement position, the positions of the protrusions 417 and 427 are shifted from the inclined portions SL11 and SL14 to the holding portions SL12 and SL15.

As a result, the electronic device 100 is mounted to the rack 200 in the state where the thermally conductive member 150 is in contact with both the electronic device 100 and the cooling plate 330. Therefore, in the electronic control unit 1000, it is possible to suppress the thermally conductive member 150 from being curled up or sheared when the electronic device 100 is being installed to the rack 200. In the electronic control unit 1000, it is also possible to suppress other loads that are generated on the thermally conductive member 150 from the electronic device 100 and the cooling plate 330 during the installation. It should be noted that electronic control unit 1000 can achieve the same effects even if the electronic control unit 1000 does not include the positioning member 510 and the base substrate 600.

The electronic control unit 1000 can transfer heat generated from the electronic device 100 to the cooling plate 330 via the thermally conductive member 150. Therefore, the electronic control unit 1000 can cool the electronic device 100 by the cooling plate 330. Moreover, the thermally conductive member 150 contacts the electronic device 100 and the cooling plate 330 in a good condition. Therefore, the electronic control unit 1000 can efficiently cool the electronic device 100.

The electronic control unit 1000 has the first protrusion 520 that positions the base substrate 600 and the positioning member 510 relative to each other, and the second protrusion 531 that is arranged coaxially with the center axis RL1 of the first protrusion 520 and that positions the electronic device 100 and the positioning member 510 relative to each other. Therefore, in the electronic control unit 1000, it is not necessary to take into consideration the tolerance caused by the first protrusion 520 and the second protrusion 531 not being coaxial. As such, the electronic control unit 1000 can improve the relative positional accuracy of the inter-board connectors 113 and 611.

The electronic control unit 1000 includes the contact portion 541 (contact surface 541*a*) provided along the center axis RL1 of the first protrusion 520. Therefore, electronic control unit 1000 can further improve the relative positional accuracy of the inter-board connectors 113 and 611.

In the positioning member 510, the center axis RL1 of the first protrusion 520 coincides with the reference position of the wiring board 111 in the X direction and with the reference surface of the wiring board 111 in the Z direction. As such, the electronic control unit 1000 enables the inter-board connectors 113 and 611 to be connected within the tolerance range. It can also be said that the positioning member 510 can connect the inter-board connectors 113 and 611 within the range of the floating amount of the floating connector. It should be noted that the electronic control unit 1000 can achieve the effects related to positioning even if the electronic control unit 1000 does not include the slide member 140 or the movable members 410 and 420.

The positioning members 510 are provided separately for each electronic device 100. In the present embodiment, the electronic control unit 100 has four positioning members 510, as an example. Therefore, in each electronic device 100, the distance from the point positioned by the positioning hole 612 and the first protrusion 520 is short, so that the dimensional tolerance can be set small, and can be easily kept in the tolerance range of the inter-board connectors 113 and 611.

In the electronic control unit 1000, the protrusions 417 and 427 of the movable members 410 and 420 holding the cooling plate 330 are held by the holding portions SL12 and SL15 of the slider 141 of the electronic device 100, in the state where the thermally conductive member 150 is pressed. Therefore, the electronic control unit 1000 can suppress the cooling plate 330 and the electronic device 100 from being separated from each other due to the reaction force of the thermally conductive member 150. As such, the electronic control unit 1000 can be configured such that the thermally conductive member 150 is in contact with the cooling plate 330 and the electronic device 100. It should be noted that electronic control unit 1000 can achieve the same effects even if the electronic control unit 1000 does not include the positioning member 510 and the base substrate 600.

Since the orthogonal distance is set by experiment, simulation, or the like so that the compressive force on the thermally conductive member 150 has an optimum value. Therefore, in the electronic control unit 1000, the thermally conductive member 150 can be compressed with an appropriate compressive force. Further, it can be said that, in the electronic control unit 1000, the distance between the cooling plate 330 and the electronic device 100 can be set so that the compressive force of the thermally conductive member 150 has an optimal value. Therefore, the electronic control unit 1000 can keep the heat transfer distance between the cooling plate 330 and the electronic device 100 constant.

The electronic device 100 is provided with the holding portions SL12 and SL15 at the four corners for engaging with the protrusions 417 and 427. Therefore, the electronic control unit 1000 can compress the thermally conductive member 150 in a state of keeping a parallel positional relationship between the facing surface SF1 and the facing surface SF4.

In the present embodiment, an example in which the thermally conductive member 150 is provided is adopted as a preferred embodiment. However, the present disclosure does not necessarily require the thermally conductive member 150. Even in such a configuration, during the installation of the electronic device 100 to the rack 200, the electronic device 100 is placed in the placement position to face the cooling plate 330 and then the positions of the protrusions 417 and 427 are shifted from the inclined portions SL11 and SL14 to the holding portions SL12 and SL15. By shifting the positions of the protrusions 417 and 427 in this manner, the electronic device 100 moves the movable members 410 and 420 so as to attract them and is mounted to the rack 200. In other words, when the electronic device 100 is installed to the rack 200, the cooling plate 330 to which the movable members 410 and 420 are fixed is attracted to the electronic device 100. Therefore, the electronic control unit 1000 can make the electronic device 100 and the cooling plate 330 closer to each other. Accordingly, the electronic control unit 1000 can improve the cooling efficiency of the electronic device 100.

The electronic control unit 1000 is configured such that, in the state where the electronic device 100 is mounted on the rack 200, the protrusions 417 and 427 are held by the holding portions SL12 and SL15, and the electronic device 100 and the cooling plate 330 are arranged in the placement position facing each other. Accordingly, the electronic control unit 1000 can improve the heat dissipation performance of the electronic device 100 by the cooling plate 330.

In the present embodiment, the second protrusion 531 provided coaxially with the center axis RL1 of the first protrusion 520 is employed as a preferred embodiment. However, in the present disclosure, a configuration in which the second protrusion 531 is not provided coaxially with the center axis RL1 of the first protrusion 520 can be adopted. Even in such a configuration, the positioning member 510 includes the first protrusion 520 which determines the position of the base substrate 600 and the positioning member 510, and the second protrusion 531 which determines the position of the electronic device 100 and the positioning member 510. That is, the positioning member 510 includes both the first protrusion 520 used for positioning with the base substrate 600 and the second protrusion 531 used for positioning with the electronic device 100. Therefore, the electronic control unit 1000 can improve the relative positional accuracy of the inter-board connectors 113 and 611.

While only the selected exemplary embodiments and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. An electronic control unit comprising:

a rack;

an electronic device installable to the rack along an installation direction orthogonal to a thickness direction of the electronic device;

a cooling plate disposed in the rack, the cooling plate being movable in the thickness direction of the electronic device; and a movable member disposed in the rack at a position to interpose the electronic device in a direction orthogonal to the installation direction and the thickness direction, the movable member holding the cooling plate to be movable in the thickness direction, the movable member having a protrusion protruding toward the electronic device, wherein the electronic device includes a pair of guide members disposed at ends in the direction orthogonal to the installation direction and the thickness direction, each of the guide members includes a guide groove to receive the protrusion of the movable member therein, the guide groove extending along the installation direction and having an open end on a leading side in the installation direction, the guide member has an inclined portion, as a part of the guide groove, inclined relative to the installation direction and a holding portion to hold the protrusion at an end of the guide groove opposite to the open end in the installation direction, the guide groove is configured to allow the protrusion to move from the inclined portion to the holding portion after the electronic device is placed in a placement position facing the cooling plate during installation to the rack, and the electronic device is configured to cause the movable member to be pulled toward the electronic device in the thickness direction in accordance with movement of the protrusion toward the holding portion, so that the electronic device in the placement position is brought to a mounting state mounted on the rack.

2. The electronic control unit according to claim 1, wherein the electronic device includes a circuit board and a case accommodating the circuit board therein, the circuit board has a wiring board and an electronic component mounted on the wiring board, the case has guide holding portions at ends in the direction orthogonal to the thickness direction and the installation direction, the guide holding portions holding the guide members therein to be movable in the installation direction, and the guide holding portion is configured to allow the guide member to move in the installation direction after the electronic device is placed in the placement position facing the cooling plate during the installation, and the electronic device causes the protrusion to move from the inclined portion to the holding portion in accordance with movement of the guide member in the guide holding portion in the installation direction.

3. The electronic control unit according to claim 2, wherein the electronic device is configured to be removable from the rack, the electronic control unit further comprising:

a push-back member configured to push the guide member in a removal direction opposite to the installation direction during removal of the electronic device from the rack.

4. The electronic control unit according to claim 1, wherein the guide member includes side wall portions facing each other, and a connecting portion connecting the side wall portions.

5. The electronic control unit according to claim 1, wherein the guide member has a plurality of the guide grooves in the installation direction, and the movable member has a plurality of the protrusions with a same number as the guide grooves.

6. The electronic control unit according to claim 5, wherein the plurality of guide grooves includes a first guide groove and a second guide groove, the first guide groove being disposed on the leading side of the second guide groove in the installation direction, and the first guide groove has an opening width greater than the second guide groove.

7. The electronic control unit according to claim 6, wherein the plurality of protrusions includes a first protrusion corresponding to the first guide groove and a second protrusion corresponding to the second guide groove, and the first protrusion has a larger diameter than the second protrusion.

8. The electronic control unit according to claim 5, wherein the plurality of guide grooves includes a first guide groove and a second guide groove, the first guide groove being disposed on the leading side of the second guide groove in the installation direction, the protrusions includes a first protrusion corresponding to the first guide groove, and a second protrusion corresponding to the second guide groove, and the second protrusion is shorter than the first protrusion.

9. The electronic control unit according to claim 1, wherein a width of the guide groove gradually increases toward the open end.

10. The electronic control unit according to claim 1, further comprising:

a thermally conductive member disposed between the electronic device and the cooling plate and in contact with the electronic device and the cooling plate in the mounting state in which the electronic device is mounted on the rack.

11. The electronic control unit according to claim 10, wherein in a state where the electronic device is placed in the placement position, the thermally conductive member is in contact with either one of the electronic device or the cooling plate, and the electronic device is configured to cause the movable member to be pulled toward the electronic device in accordance with the movement of the protrusion from the inclined portion toward the holding portion, so that the electronic device placed in the placement position is brought into the mounting state in which the thermally conductive member is in contact with both the electronic device and the cooling plate.

* * * * *